United States Patent [19]

Akiyama et al.

[11] Patent Number: 5,942,368
[45] Date of Patent: Aug. 24, 1999

[54] PIGMENT DISPERSION COMPOSITION

[75] Inventors: Takeo Akiyama; Shinya Watanabe, both of Hino, Japan

[73] Assignee: Konica Corporation, Tokyo, Japan

[21] Appl. No.: 08/844,928

[22] Filed: Apr. 22, 1997

[30] Foreign Application Priority Data

| Apr. 23, 1996 | [JP] | Japan | 8-101254 |
| Apr. 23, 1996 | [JP] | Japan | 8-101255 |
| Jul. 25, 1996 | [JP] | Japan | 8-196433 |

[51] Int. Cl.$^6$ .......... G03C 1/54; G03F 7/008; G03F 7/016; G03F 7/022
[52] U.S. Cl. .......... 430/176; 430/170; 430/191; 430/196; 430/270.1; 252/357; 252/600; 106/499
[58] Field of Search .......... 430/270.1, 191, 430/196, 176, 170; 252/357, 600; 106/499

[56] References Cited

U.S. PATENT DOCUMENTS

| 2,761,865 | 9/1956 | Goldberg et al. . | |
| 2,965,511 | 12/1960 | Moser . | |
| 3,300,309 | 1/1967 | Chu . | |
| 3,370,971 | 2/1968 | Linton . | |
| 3,479,185 | 11/1969 | Chambers, Jr. . | |
| 3,775,113 | 11/1973 | Bonham et al. . | |
| 3,784,557 | 1/1974 | Cescon . | |
| 4,072,527 | 2/1978 | Fan . | |
| 5,034,508 | 7/1991 | Nishizaki et al. | 252/357 |
| 5,082,498 | 1/1992 | Kurtz et al. | 252/357 |
| 5,278,022 | 1/1994 | Wade et al. | 430/191 |
| 5,589,315 | 12/1996 | Iida et al. | 430/176 |
| 5,641,594 | 6/1997 | Kudo et al. | 430/196 |

FOREIGN PATENT DOCUMENTS

| 1047569 | 11/1966 | European Pat. Off. . |
| 1459563 | 12/1976 | European Pat. Off. . |
| 46-7294 | 12/1941 | Japan . |
| 47-41830 | 12/1972 | Japan . |
| 48-63802 | 9/1973 | Japan . |
| 48-63803 | 9/1973 | Japan . |
| 48-96575 | 12/1973 | Japan . |
| 56-142528 | 11/1981 | Japan . |
| 56-161827 | 12/1981 | Japan . |
| 56-167761 | 12/1981 | Japan . |
| 56-167762 | 12/1981 | Japan . |
| 57-192952 | 11/1982 | Japan . |
| 58-43451 | 3/1983 | Japan . |
| 58-59444 | 4/1983 | Japan . |
| 58-75152 | 5/1983 | Japan . |
| 58-190952 | 11/1983 | Japan . |
| 59-84241 | 5/1984 | Japan . |
| 59-97140 | 6/1984 | Japan . |
| 59-121336 | 7/1984 | Japan . |
| 60-28649 | 2/1985 | Japan . |
| 1-169449 | 7/1989 | Japan . |
| 1-169450 | 7/1989 | Japan . |
| 1-205149 | 8/1989 | Japan . |
| 02-176754 | 7/1990 | Japan . |
| 2-173645 | 7/1990 | Japan . |
| 2-275954 | 11/1990 | Japan . |

*Primary Examiner*—John S. Chu
*Attorney, Agent, or Firm*—Finnegan, Henderson, Farabow, Garrett & Dunner, L.L.P.

[57] ABSTRACT

A composition dispersing a colorant is disclosed. The dispersion composition comprises a compound represented by formula;

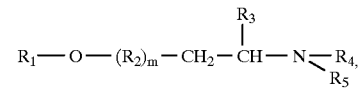

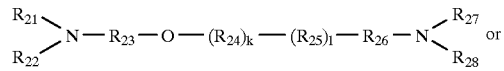

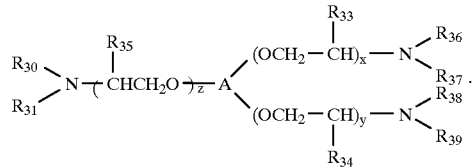

Detailed definition is disclosed in the specification.

11 Claims, No Drawings

PIGMENT DISPERSION COMPOSITION

TECHNICAL FIELD OF THE INVENTION

The present invention relates to a dispersion composition wherein solid particles are dispersed into liquid, especially into organic liquid and the use thereof.

TECHNICAL BACKGROUND OF THE INVENTION

It is indispensable for the manufacture of paints, inks, etc. to disperse finely solid into liquid and to hold the stability of the state for a long period. Moreover, in recent years, in order to increase production efficiency, for example, such a case has increased wherein when various kinds of products composed of one kind of a dispersed solid and different kinds of added polymers are needed, various kinds of the final products are manufactured by adding necessary materials to a solid dispersion which has been prepared in advance. For example, Japanese Patent Application Open to Public Inspection No. 7294/1971 illustrates the preparation of a solid dispersion with use of a dispersing aid having various structures. In addition, Japanese Patent Publication Nos. 30057/1988 and 25251/1982 describe a dispersing agent having a specific structure and a solid dispersion composed of organic liquid containing said dispersing agent therein. However, it is very difficult to disperse finely solid into liquid and to keep the stability of the state for a long time. Manufacturers of paints and inks produce the products utilizing the pertinent combination obtained empirically by trial and error. When the preparation of a composition is intended by adding a polymer, other solvent, etc. to an available dispersion, the finely dispersed state is likely destroyed by the addition of some kinds of compounds, that is, the solid in the dispersion often falls down. Furthermore, even though a conventional dispersing aid or dispersing agent is employed, there have been problems such that a solid dispersion having satisfactory dispersion properties and stability, and good compatibility with various kinds of materials is not obtained.

In recent years, a light-sensitive composition comprising a colorant has been often used for the preparation of the light-sensitive material for color proofs for color proofing in color printing and a color filter for liquid crystal. For example, as for the color proofs, Japanese Patent Publication Open to Public Inspection Nos.169449/1989 and 169450/1989 describe an image-forming method wherein an image-forming material having a light-sensitive colored layer composed of a colorant and a light-sensitive composition is exposed and developed, and a n image part of the resulting colored image is only transferred to form an image. Furthermore, Japanese Patent Publication Open to Public Inspection No. 275954/1990 describes an image-forming method wherein an image-forming material comprising a positive-type light-sensitive composition having quinonediazide, an acid-decomposing composition and a binder composed of any of vinyl carboxylate polymers is exposed and developed, and the resulting image part is only transferred to form an image. In addition, Japanese Patent Publication Open to Public Inspection No. 176754/1990 and 173645/1990 describe an image-forming method wherein in the former, a light-sensitive material having a negative-type light-sensitive composition composed of any of photopolymerization compounds and in the latter, a light-sensitive material having a negative-type light sensitive composition composed of any of azides are exposed and developed, and the resulting image part is only transferred to form an image.

In addition, it is known that a light-sensitive liquid into which a colorant is dispersed is used for a photoresist (preparation of a color filter for liquid crystal, etc.) and the like.

These light-sensitive compositions are coated on a support and dried. After the light-sensitive layer is formed, in most cases, it is exposed and developed. However, during development, sometimes a colorant in the non-image part is not perfectly removed and remains on the support. When this occurs, for example, for a light-sensitive material for color proofs, not only neither intended image pattern nor hue is obtained but also the colorant adheres to a transport roller in a development processing machine and a color proof which is subsequently developed is stained. This has been a cause of degrading quality of the color proofs which is successively developed.

SUMMARY OF THE INVENTION

The object of the present invention is to provide a solid dispersion composition having excellent dispersion properties and dispersion stability, and improved compatibility with various materials. Another object of the present invention is to provide a light-sensitive composition having high sensitivity and excellent developability with use of a coating solution comprising said composition.

The dispersion composition of the present invention comprises a compound represented by formula (1), (2) or (3) and a colorant.

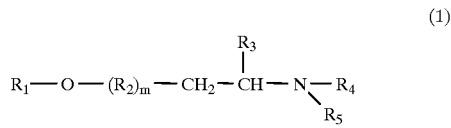

$R_1$ represents a hydrogen atom, a straight or branched chain alkyl group which may have a substituent group having from 1 to 30 carbon atoms, and an alicyclic hydrocarbon group, an aromatic hydrocarbon group or heterocyclic group each of which may have a substituent group, and m represents an integer of 0 or more. $R_2$ represents:

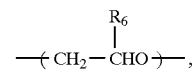

$R_3$ and $R_6$ each represent the same as $R_1$, and $R_4$ and $R_5$ each represent:

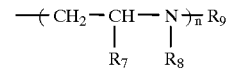

$R_7$, $R_8$ and $R_9$ each represent the same as $R_1$ and n represents an integer of 0 or more.

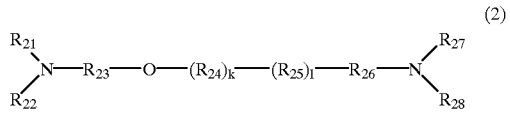

$R_{21}$, $R_{22}$, $R_{27}$, and $R_{28}$ each represent a hydrogen atom, a straight or branched chain alkyl group which may have a substituent group having from 1 to 30 carbon atoms, and an alicyclic hydrocarbon, aromatic hydrocarbon group or heterocyclic group, each of which may have a substituent group, and $R_{23}$, $R_{24}$, $R_{25}$ and $R_{26}$ each represent the following structural formula, and $R_{202}$, $R_{203}$, $R_{204}$, $R_{205}$, and $R_{206}$ each are the same as $R_{21}$, and k represents an integer of 0 or more and 1 represents an integer of 1 or more.

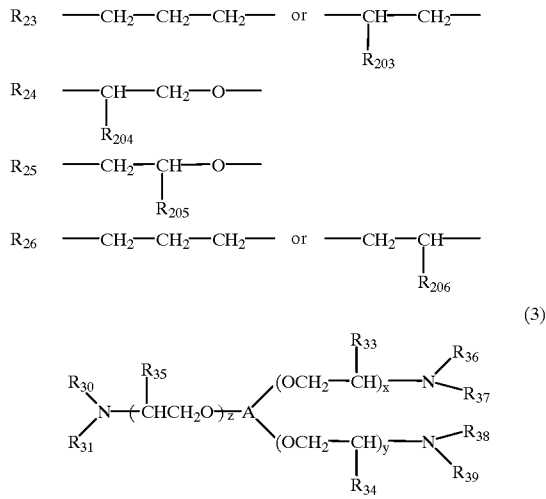

(3)

A represents a straight or branched alkyl group having at least 3 hydroxyl groups, which may have an substituent group, an alicyclic hydrocarbon, aromatic hydrocarbon, heterocyclic group or a residual group of a heterocyclic group, each of which may have a substituent group, and $R_{30}$ to $R_{39}$ each represent a hydrogen atom, a straight or branched chain alkyl group which may have a substituent group having from 1 to 30 carbon atoms, and x, y and z each represent an integer of 1 or more and the total of them is 5 or more.

This dispersion composition can be applied to a light-sensitive material. This dispersion composition can beapplied to ink for an ink jet printer. Compounds represented by the formula (1) are preferably used.

DETAILED DESCRIPTION OF THE PRESENT INVENTION (A) Dispersing Aid

Compounds represented by the formula (1), (2) and (3) are dispersing aids.

In the compounds represented by the formula (1), $R_1$ represents a hydrogen atom, a straight or branched chain alkyl group which may have a substituent group having from 1 to 30 carbon atoms, and an alicyclic hydrocarbon, aromatic hydrocarbon or heterocyclic group each of which may have a substituent group.

The straight or branched chain alkyl groups having from 1 to 30 carbon atoms include, for example, a methyl group, an ethyl group, a butyl group, a t-butyl group, a n-hexcyl group, a n-octyl group, a n-stearyl group, a 4-octyl-octadecyl group, a 4-hydroxy-octadecyl group, a 4-methoxy-octyl group, a 5-nitro-nonyl group, etc.

The alicyclic hydrocarbon groups include, for example, a cyclohexyl group, a methylcyclohexyl group, a hydroxycyclohexyl group, a 1-cyclohexyl group, etc.

The aromatic hydrocarbon groups include, for example, a phenyl group, a toluyl group, a xylyl group, a naphtyl group, a 4-methoxyphenyl group, a 4-nitrophenyl group, etc.

The heterocyclic groups include a 2-furyl group, a 2-pyrrolyl group, a 2-pyridyl group, 4-pyridyl group, a 2-quinolyl group, a 4-hydroxy-2-quinolyl group, a 4-quinolyl group, a furfryl group, a 2-thienyl group, etc.

$R_1$ is a straight or branched chain alkyl group having preferably from 1 to 18 carbon atoms and most preferably from 1 to 4 carbon atoms, and m is an integer of 0 or more, preferably from 10 to 100.

Groups and atoms which can be substituted to $R_1$ in the above-mentioned straight or branched chain alkyl group, alicyclic hydrocarbon group, aromatic hydrocarbon group and heterocyclic group are not limited. Examples include an amino group, an alkyl amino group, a halogen atom such as a chlorine atom, a bromine atom, etc., a hydroxy group, an alkoxy group, a nitro group, an amide group, an alkylamide group, a carboxyl group, a sulfonate group, a sulfonamide group, a carboxylic acid ester group such as a methoxycarbonyl group, etc., a substituted or unsubstituted aromatic hydrocarbon and a heterocyclic group, etc.

In addition, $R_2$ represents:

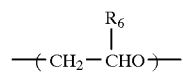

$R_3$ and $R_6$ each are the same as $R_1$. Furthermore, $R_6$ is preferably a hydrogen atom or a methyl group. Depending on $R_6$ at the bonding group represented by the formula (2), $R_2$ may form a random bonding having irregularity in arrangement and order, an alternative bonding in which two kinds of bonding groups are alternately arranged or a block bonding in which the same bonding groups are combined in a long and continuous bond.

$R_4$ and $R_5$ each represent:

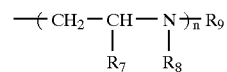

$R_7$, $R_8$ and $R_9$ each are the same as $R_1$. $R_7$ is preferably a hydrogen atom. $R_8$ and $R_9$ each are preferably a hydrogen atom or an alkyl group having from 1 to 18 carbon atoms and n represents an integer of 0 or more, preferably from 0 to 10, most preferably 0.

Illustrative examples of compounds represented by the formula (1) follows.

(1)-1

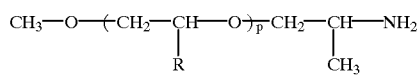

R:H or CH$_3$
(number ratio of H/CH$_3$ = 3/32) p = 35

-continued
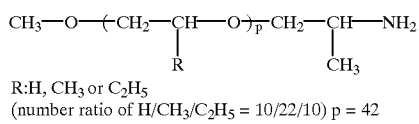
(1)-2
R:H, CH₃ or C₂H₅
(number ratio of H/CH₃/C₂H₅ = 10/22/10) p = 42
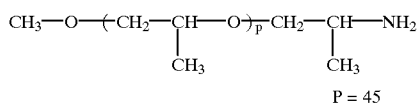
(1)-3
P = 45
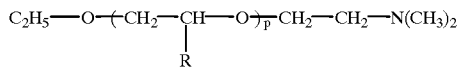
(1)-4
R:H or CH₃
(number ratio of H/CH₃) = 32/12) p = 42
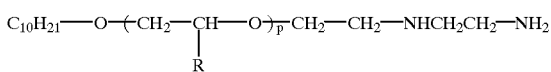
(1)-5
R:H or CH₃
(number ratio of H/CH₃) = 15/55) p = 67
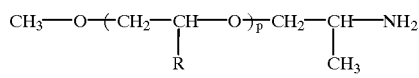
(1)-6
R:H or CH₃
(number ratio of H/CH₃) = 15/22) p = 37
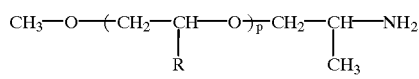
(1)-7
R:H or CH₃
(number ratio of H/CH₃) = 32/10) p = 42
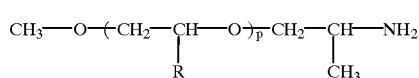
(1)-8
R:H or CH₃
(number ratio of H/CH₃) = 25/17) p = 42
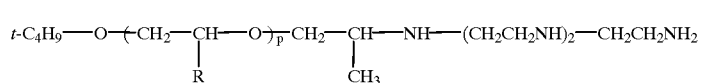
(1)-9
R:H or CH₃
(number ratio of H/CH₃) = 10/28) p = 38
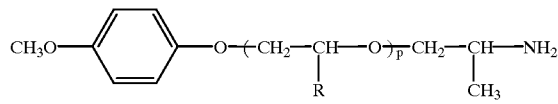
(1)-10
R:H or CH₃
(number ratio of H/CH₃) = 3/32) p = 35
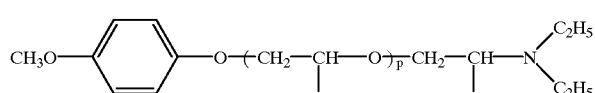
(1)-11
R:H or CH₃
(number ratio of H/CH₃) = 30/30) p = 60

-continued
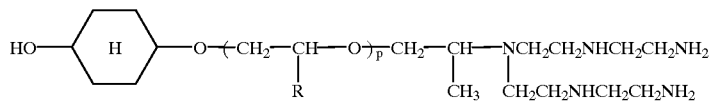
(1)-12
R:H or CH₃
(number ratio of H/CH₃) = 10/70) p = 80
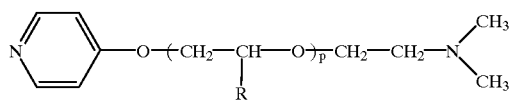
(1)-13
R:H or CH₃
(number ratio of H/CH₃) = 15/35) p = 45
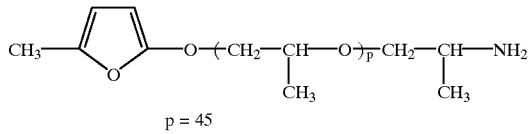
(1)-14
p = 45
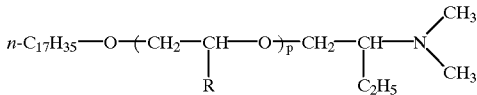
(1)-15
R:H, CH₃ or C₂H₅
(number ratio of H/CH₃/C₂H₅ = 20/20/10) p = 50
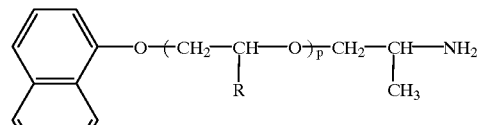
(1)-16
R:H or CH₃
(number ratio of H/CH₃) = 15/35) p = 50
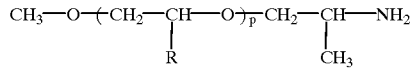
(1)-17
R:H or CH₃
(number ratio of H/CH₃ = 32/10) p = 42
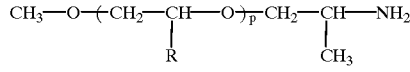
(1)-18
R:H or CH₃
(number ratio of H/CH₃ = 3/32) p = 35
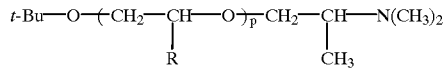
(1)-19
R:H or CH₃
(number ratio of H/CH₃ = 19/3) p = 22
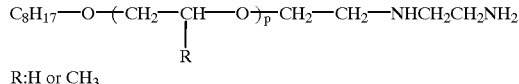
(1)-20
R:H or CH₃
(number ratio of H/CH₃ = 45/17) p = 62
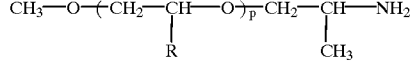
(1)-21
R:H or CH₃
(number ratio of H/CH₃ = 32/10) p = 42

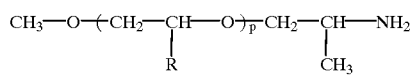
(1)-22

R:H or CH$_3$
(number ratio of H/CH$_3$ = 3/32) p = 35

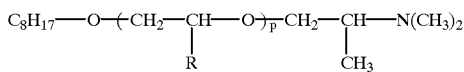
(1)-23

R:H or CH$_3$
(number ratio of H/CH$_3$ = 50/12) p = 62

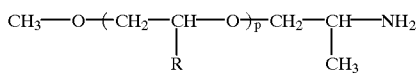
(1)-24

R:H or CH$_3$
(number ratio of H/CH$_3$ = 32/10) p = 42

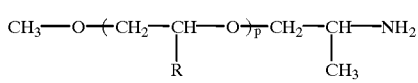
(1)-25

R:H or CH$_3$
(number ratio of H/CH$_3$ = 0/40) p = 40

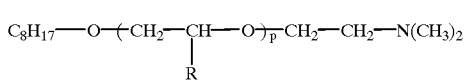
(1)-26

R:H or CH$_3$
(number ratio of H/CH$_3$ = 30/5) p = 35

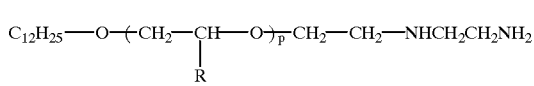
(1)-27

R:H or CH$_3$
(number ratio of H/CH$_3$ = 12/60) p = 72

In the present invention, compounds represented by the following formula (4) are preferable.

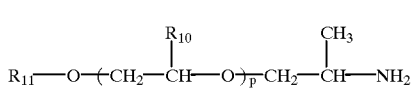
(4)

In the formula (4), $R_{10}$ represents a hydrogen atom and a methyl group, $R_{11}$ represents a straight or branched chain alkyl group, and p is from 10 to 50.

In dispersing aids represented by the formula (2), $R_{21}$, $R_{22}$, $R_{27}$ and $R_{28}$ each represent a hydrogen atom, a straight or branched chain alkyl group which may have a substituent group having from 1 to 30 carbon atoms, and an alicyclic hydrocarbon group, aromatic hydrocarbon group or heterocyclic group, each of which may have a substituent group.

The straight or branched chain alkyl group having from 1 to 30 carbons includes, for example, a methyl group, an ethyl group, a butyl group, a t-butyl group, a n-hexcyl group, a n-octyl group, a n-stearyl group, a 4-octyl-octadecyl group, a 4-hydroxy-octadecyl group, a 4-methoxyoctyl group, a 5-nitrononyl group, etc. The alicyclic group represents, for example, a cyclohexyl group, a methylcyclohexyl group, a hydroxycyclohexyl group, a cyclopentyl group, a cyclooctyl group, an ethylcyclohexyl group, a 1-cyclohexenyl group, etc. The aromatic hydrocarbon group includes, for example, a phenyl group, a toluyl group, a xylyl group, a naphtyl group, a 4-methoxyphenyl group, a 4-nitrophenyl group, etc. The heterocyclic group represents a 2-furyl group, a 2-pyrrolyl group, a 2-pyridyl group, a 4-pyridyl group, a 2-quinolyl group, a hydoxy-2-quinolyl group, 4-quinolyl group, a furfuryl group, a 2-thienyl group, etc.

$R_{21}$, $R_{22}$, $R_{27}$ and $R_{28}$ each are preferably a hydrogen atom and a straight or branched chain alkyl group having from 1 to 18 carbon atoms, more preferably a hydrogen atom and said alkyl group having from 1 to 4 carbon atoms and most preferably an hydrogen atom and a methyl group. n is an integer of 0 or more and m is an integer of 1 or more, preferably 10 or more.

No restriction is made for a substituent atom and group which can be substituted to $R_{21}$, $R_{22}$, $R_{27}$ and $R_{28}$ of said straight or branched chain alkyl group, said alicyclic hydrocarbon group, said aromatic hydrocarbon group and said heterocyclic group. The examples include an amino group, an alkylamino group, a halogen atom such as a chlorine atom and a bromine atom, a hydroxy group, an alkoxy group, a nitro group, an amide group, an alkyl amide group, a carboxyl group, a sulfonate group, a sulfonamide group, a carboxylic acid ester group such as a methoxycarbonyl group, a substituted or unsubstituted aromatic hydrocarbon and heterocyclic group.

$R_{23}$, $R_{24}$, $R_{27}$ and $R_{28}$ each

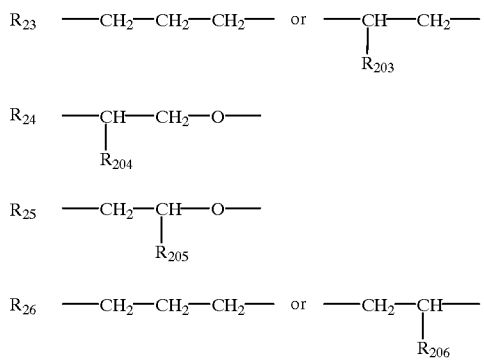

$R_{203}$, $R_{204}$, $R_{206}$ and $R_{206}$ each are the same as $R_{21}$. In accordance with $R_{204}$ and $R_{205}$, $R_{24}$ and $R_{25}$ may form a random bond having irregular arrangement and order, an alternate bond wherein two kinds of bonding groups are alternately arranged and a block bond having long continuous arrangement of the same kind of bonding groups.

In dispersing aids represented by the formula (3), A represents a straight or branched chain alkyl group having at least 3 hydroxyl groups, which may have a substituent group, and an alicyclic, aromatic hydrocarbon group or hetercyclic group, each of which may have a substituent group. Said alkyl group, alicyclic hydrocarbon group, aromatic hydrocarbon group and heterocyclic group each are the same as $R_{21}$ of the formula (2) and preferably trimethylolpropane and a residual group of glycerin. x, y and z each are an integer of 1 or more and the total of them is an integer of 5 or more, and preferably each is 5 or more, more preferably each is 10 or more. $R_{30}$ to $R_{39}$ each are the same as said $R_{21}$.

Dispersing aids represented by the formula (2) and (3) are illustrated.

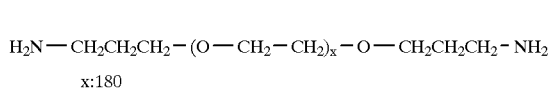
(2)-1
x:180

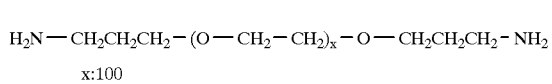
(2)-2
x:100

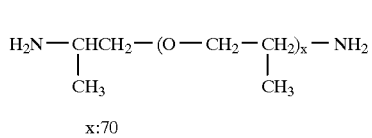
(2)-3
x:70

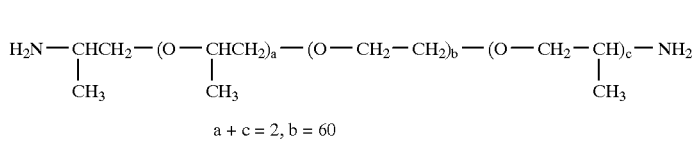
(2)-4
a + c = 2, b = 60

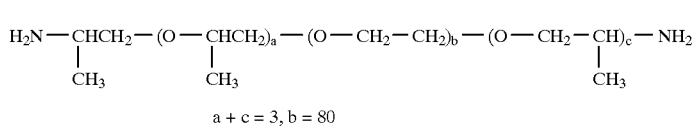
(2)-5
a + c = 3, b = 80

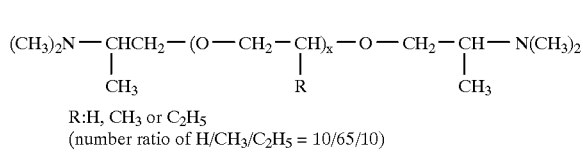
(2)-6
R:H, CH$_3$ or C$_2$H$_5$
(number ratio of H/CH$_3$/C$_2$H$_5$ = 10/65/10)
x:85

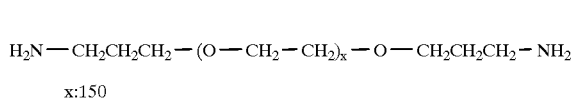
(2)-7
x:150

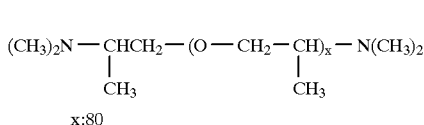
(2)-8
x:80

-continued
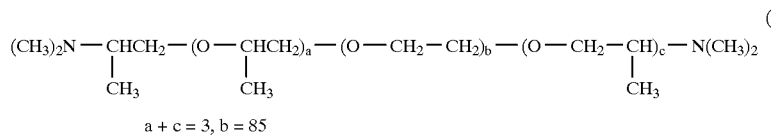
(2)-9
a + c = 3, b = 85
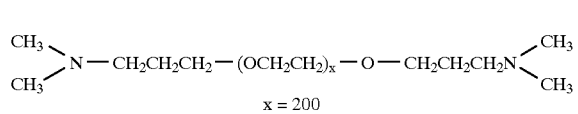
(2)-10
x = 200
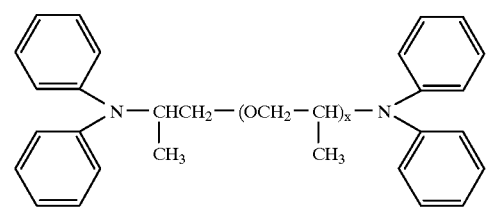
(2)-11
x = 75
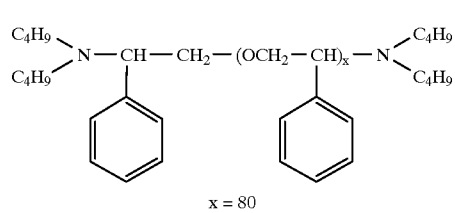
(2)-12
x = 80
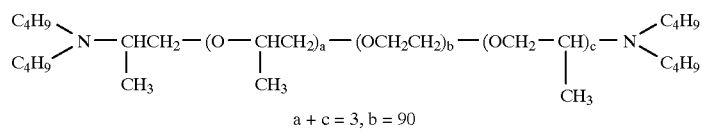
(2)-13
a + c = 3, b = 90
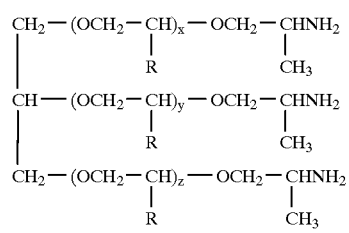
(3)-1
R: H or CH$_3$
(number ratio of H/CH$_3$ = 50/100)
x + y + z = 150
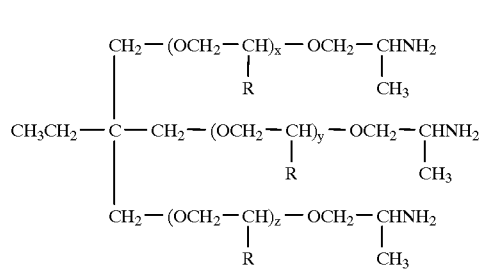
(3)-2
R: H or CH$_3$
(number ratio of H/CH$_3$ = 100/50)
x + y + z = 150

-continued

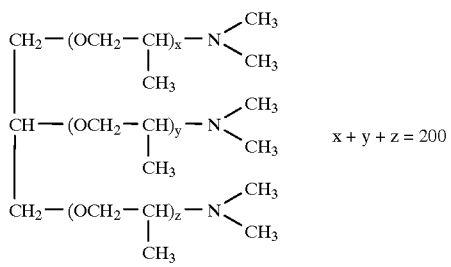

$x + y + z = 200$ (3)-3

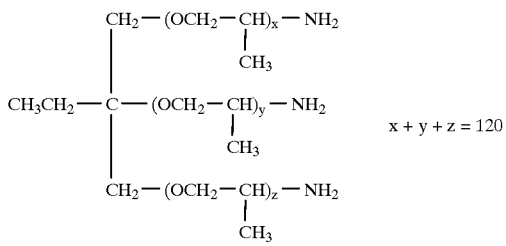

$x + y + z = 120$ (3)-4

These compounds can be easily synthesized and can be commercially available, for example, from Huntsman Corporation.

(B) Solid Dispersion Composition

The dispersing aids represented by formulas (1), (2) or (3) have excellent capability for preparing a dispersion wherein solid, preferably colorant, specifically pigment and/or dye is dispersed into an organic solvent mentioned later. In practice, the dispersing aids (hereinafter, referred to as "compound of the present invention") represented by the formulas (1), (2) or (3) may be used individually or in combination.

A solid dispersion can be prepared by any of conventional methods known in the art. A solid to be dispersed, an organic solvent and a compound of the present invention are mixed in any optional order. The resulting mixture undergoes mechanical treatment to decrease the particle diameter such as, for example, ball mill treatment, beads mill treatment, gravel mill, plastic roller treatment, etc. and said dispersion is obtained. In some cases, in order to decrease the diameter of the solid particles, the solid can be individually processed or processed upon mixing the solid with an organic solvent. Then, the solid is mixed with one or more of the other materials and the resulting mixture is stirred to obtain a dispersion. As described above, is obtained the solid dispersion comprising a finely dispersed solid particles having a small diameter and the compound of the present invention. An amount of the compound of the present invention in the solid dispersion has no specific limitation. However, the amount is preferably from 0.1 to 60 weight percent of the weight of the solid. There is no limitation for the mixing ratio, when two different compounds of the present invention represented by the formulas (1), (2) or (3) are mixed and used. The ratio is preferably from 1/99 to 99/1 and more preferably from 10/90 to 90/10.

As a colorant which is an example of the solid, various kinds of dyes and pigments can be used. In the present invention, there are available pigments and dyes having various colors for printing use, for example, those matching to yellow, magenta, cyan and black and having color of blue, green, red. In addition, metal powders, white pigments, fluorescent pigments, etc. can be dispersed.

Examples of the pigments and dyes which can be used in the present invention are illustrated. Examples include organic pigments and dyes such as azo derivatives, phthalocyanine derivatives, quinacridone derivatives, anthraquinone derivatives, indigo derivatives, methine derivatives, etc. and inorganic pigments. Illustrative examples follows.

| (C.I. stands for color index.) | |
|---|---|
| Lemon Chrome Yellow M35 | (C.I. 77603) |
| Medium Chrome Yellow | (C.I. 77600) |
| Molybudate Orange | (C.I. 77605) |
| Milori Blue 671 | (C.I. 77510) |
| Seika Light Blue | (C.I. 74200) |
| Seika Light Rose | (C.I. 45160:1) |
| Seika Light Magenta | (C.I. 45170:2) |
| Seika Light Blue | (C.I. 42595:2) |
| Seika Light Violet B800 | (C.I. 42535:2) |
| Seika Fastlake Red CZA665 | (C.I. 15585:1) |
| Seika Fast Red LR116 | (C.I. 15630:1) |
| Seika Fast Carmine 6B 1488 | (C.I. 15850:1) |
| Seika Fast Red 8040 | (C.I. 15865:1) |
| Seika Fast Yellow 10GH | (C.I. 11710) |
| Seika Fast Yellow GH | (C.I. 11680) |
| Seika Fast Yellow 2015 | (C.I. 11741) |
| Seika Fast Yellow A-3 | (C.I. 11737) |
| Seika Fast Yellow 2300 | (C.I. 21090) |
| Seika Fast Yellow 2200 | (C.I. 21095) |
| Seika Fast Yellow 2400 | (C.I. 21105) |
| Seika Fast Yellow 2600 | (C.I. 21100) |
| Seika Fast Yellow 2500 | (C.I. 21096) |
| Seika Fast Yellow 2720 | (C.I. 21108) |
| Seika Fast Orange 2900 | (C.I. 21160) |
| Seika Fast Orange 900 | (C.I. 21110) |
| Seika Fast Orange 3044 | (C.I. 12075) |
| Seika Fast Red 930 (B) | (C.I. 21120) |
| Seika Fast Scarlet G conc | (C.I. 12315) |
| Seika Fast Carmine 3840 | (C.I. 12490) |
| Seika Fast Carmine 3870 | (C.I. 12485) |
| Seika Fast Rubin RK-1 | (C.I. 12317) |
| Seika Fast Violet FR | (C.I. 12322) |
| Fine Blue 4920 | (C.I. 74160) |
| Chromo Fine Green 2GO | (C.I. 74260) |
| Chromo Fine Yellow 5910 | (C.I. 20035) |
| Chromo Fine Orange 6726 | (C.I. not listed) |

| (C.I. stands for color index.) | |
|---|---|
| Chromo Fine Scarlet 6750 | (C.I. not listed) |
| Chromo Fine Red 6820 | (C.I. 46500) |
| Chromo Fine Violet | (C.I. 51319) |
| Above compounds are manufactured by Dainichiseika Colour & Chemicals Mfg. CO., Ltd. | |
| Shimura Fast Yellow 8GTF | (C.I. 21105) |
| Shimura Fast Yellow 4186 | (C.I. 11767) |
| Shimura Fast Yellow 4193G | (C.I. 21100) |
| Shimura Fast Yellow GHK-N4 | (C.I. 21090) |
| Shimura Fast Yellow GTF230T | (C.I. not listed) |
| Shimura Fast Yellow RF | (C.I. 21096) |
| Shimura Fast Yellow 418 | (C.I. 21108) |
| Fastgen Super Yellow GRO | (C.I. 56280) |
| Shimura Fast Pyrazolone Orange | (C.I. 211100) |
| Shimura Fast Orange V | (C.I. 21160) |
| Shimura Fast Orange 4183H | (C.I. 11780) |
| Shimura Lake Red C conc 130 | (C.I. 15585:1) |
| Shimura Neotol Red 2BY | (C.I. 15565:1) |
| Shimura Red 2BS | (C.I. 15865:1) |
| Fastgen Super Red 2Y | (C.I. 73905) |
| Fastgen Super Red 7083Y | (C.I. 46500) |
| Shimura Red 3013 | (C.I. 15865:2) |
| Shimura Brilliant Carmine 6B246 | (C.I. 15850:1) |
| Fastgen Super Magenta R | (C.I. 73915) |
| Fastgen Super Violet RNS | (C.I. 51319) |
| Fastgen Super Blue 6016 | (C.I. 69800) |
| Fastgen Blue BSF-A | (C.I. 74160) |
| Fastgen Blue TGR-L | (C.I. 74160) |
| Fastgen Green S | (C.I. 74260) |
| Fastgen Green 2YK | (C.I. 74265) |
| Above compounds are manufactured by Dainippon Ink and Chemicals, Inc. | |
| Oriental Yellow | (C.I. 11680) |
| Victoria Pure Blue | (C.I. 42595) |
| Lionol Red 7B4401 | (C.I. 15830) |
| Lionol Red 3901 | (C.I. 12120) |
| Lionol Red FB5500 | (C.I. 12490) |
| Lionol Red FBK | (C.I. 12490) |
| Lionol Yellow No. 7100 | (C.I. 21096) |
| Lionol Yellow GG-3 | (C.I. 21127) |
| Lionol Yellow NBR | (C.I. 21108) |
| Lionol Yellow 1806-G | (C.I. 21127) |
| Lionol Red 2BK | (C.I. 15865:4) |
| Lionol Yellow K-5G | (C.I. 13960) |
| Lionol Yellow K-2R | (C.I. 13955) |
| Lionol Yellow FGG-3 | (C.I. 21127) |
| Lionol Blue 7210-V | (C.I. 74160) |
| Lionol Blue SM | (C.I. 74160) |
| Lionol Blue FG-7330 | (C.I. 74160) |
| Lionol Blue SPG-8 | (C.I. 74160) |
| Lionol Blue ESP-S | (C.I. 74160) |
| Lionol Blue ES | (C.I. 74160) |
| Lionol Green B-201 | (C.I. 74260) |
| Lionol Green Y-101 | (C.I. 74260) |
| Lionol Green 6Y-501 | (C.I. 74160) |
| Reonogen Yellow G-F | (C.I. 70600) |
| Reonogen Yellow 3G-F | (C.I. not listed) |
| Reonogen Yellow RX-F | (C.I. 66280) |
| Reonogen Orange R-F | (C.I. 11780) |
| Reonogen Orange GR-F | (C.I. 71105) |
| Reonogen Brown R-F | (C.I. 12510) |
| Reonogen Red Y-F | (C.I. 46500) |
| Reonogen Red 6B-F | (C.I. 46500) |
| Reonogen Red GD-F | (C.I. 53900) |
| Reonogen Magenta R-F | (C.I. 73915) |
| Reonogen Violet RL-F | (C.I. 51319) |
| Reonogen Blue R-F | (C.I. 69800) |
| Reonogen Blue R3-F | (C.I. 69800) |
| Above compounds are manufactured by Toyo Ink Mfg. Co. Ltd. | |
| Auramine | (C.I. 41000) |
| Carotine Brilliant Flavine | (C.I. Basic 13) |
| Rhodamine 6GCP | (C.I. 45160) |
| Rhodamine B | (C.I. 45170) |
| Safranine OK 70:100 | (C.I. 50240) |
| Eryograusine X | (C.I. 42080) |
| Fast Black HB | (C.I. 26150) |
| Benzidine Yellow 4T-564 D | (C.I. 21095) |
| Mitsubishi Carbon Black MA-1000 | |
| Mitsubishi Carbon Black #30, #40, #50 | |

In addition, are included ε-type copper phthalocyanine, β-type copper phthalocyanine, Brilliant Carmine 6B, Wochan Red B, C.I. Pigment Red 122 and 176 and Pigment Yellow 12, and dye derivatives described in Japanese Patent Publication No. 28884/1964 and Japanese Patent Publication Open to Public Inspection No. 205149/1989.

As solvents, organic solvents are preferably used. Examples include chlorinated carbon solvents such as methylene chloride, chloroform, trichlorethane, trichloroethylene, chlorobenzene, dichlorobenzene, carbon tetrachloride; alcohol derivative solvents such as furfuryl alcohol, tetrahydrofurfuryl alcohol, benzyl alcohol; ether derivative solvents such as dioxane, tetrahydrofuran; ethylene glycol monoalkyl ether and diethylene glycol monoalkyl ether derivative solvents such as ethylene glycol monomethyl ether, ethylene glycol monoethyl ether, ethylene glycol monopropyl ether, ethylene glycol monobutyl ether, diethylene glycol monomethyl ether, diethylene glycol monoethyl ether, diethylene glycol monopropyl ether, diethylene glycol monobutyl ether, etc.; ester solvents such as ethylene glycol ethyl ether acetate, diethylene glycol ethyl ether acetate, ethylacetate, etc.; nitrogen containing compounds such as dimethylformamide, methylpyrrolidone, nitroethane, nitrobenzene, etc.; ketone solvent such as methyl ethyl ketone (MEK), methyl isobutyl ketone (MIBK), cyclohexanone, methylcyclohexane, 4-mehtyl-4-methoxy-2-pentanone, etc.; and dimethylsulfoxide and toluene. Among these, one or more are selected and practiced.

A solid dispersion composition containing finely divided solid which is free from coagulation is a fluid or semifluid. It is possible to apply each of these solid dispersions to various conventional fields. Accordingly the solid dispersion composition is useful for preparing rotogravure ink for publication and printing ink for newspaper when said composition is mixed with other materials to prepare said ink. The solid dispersion is also useful to prepare paint when said composition is mixed with an alkyd resin or the other resin. Furthermore, said solid composition is used to prepare ink for fiber printing, and solvent dying ink, and is useful for transferring printing when a sublimable dye is used. Furthermore, said solid composition is useful for the preparation of ink for an ink jet printer and compositions for preparing a color proofs light-sensitive material and a color filter for liquid crystal.

In conventional examples, when the other material such as a light-sensitive liquid described later is added to the solid dispersion, the finely dispersed state is destroyed, that is, the diameter of solid particles increases and the dispersed solid falls down. When the compound of the present invention is used, such phenomenon is prevented and the composition shows good compatibility with the other material added.

(C) Light-sensitive Composition

It is possible to prepare a light-sensitive composition from said solid dispersion to which a light-sensitive compound is applied.

The light-sensitive compound used for a light-sensitive composition is reactive to radiation to enable the formation of image due to the reaction. Either a negative-type or a positive-type light-sensitive compound can be used.

As the negative-type light-sensitive compounds for embodying a negative-type light-sensitive composition, diazo compounds or azide compounds can be practiced. The diazo compounds are defined as having at least one diazo group in the molecule and include chain diazo and aromatic diazo compounds. Diazo resins described below are preferable. In the present invention, the azide compounds are defined as having at least one $N_3$ group in the molecule. A light-sensitive element can contain one or more of the diazo compounds, one or more of the azide compounds, or one or more of each of the diazo and azide compounds. In the negative-type light-sensitive composition, an amount of the diazo compounds/azide compounds is preferably from 0.5 to 40 weight percent of the solid in said light-sensitive composition and more preferably from 2 to 30 weight percent.

In practice, diazo resins represented by a condensation product of an aromatic diazonium salt with formaldehye or acetaldehyde is preferable. Condensation product salts of p-diazodiphenylamine with formaldehyde or acetaldehyde are particularly preferable, for example, hexafluoro borate phosphate, tetrafluoro borate; diazo resin inorganic salts prepared as a reaction product of said condensation product with perchloric acid or periodic acid; diazo resin organic salts prepared as a reaction product of said condensation product with sulfonic acid such as paratoluene sulfonic acid or their salts, or hydroxyl group-containing compounds, for example, 2,4-dihydroxybezophenone, 2-hydroxy-4-methoxy-benzophenone-5-sulfonic acid or their salts as disclosed in U.S. Pat. No. 3,300,309.

As the other negative-type light-sensitive compounds, photopolymerization-type light-sensitive compositions can be used. The photopolymerization compounds known in the art can be used in the photopolymerization-type light-sensitive composition.

The photopolymerization compounds are used which are described, for example, in Japanese Patent Publication Nos. 5093/1960, 14719/1960 and 28727/1969. Examples include polyol acrylic acids or methacrylic esters, for example, diethyleneglycol di(metha)acrylate, triethyleneglycol di(metha)acrylate, pentaerythritol tri(metha)acrylate, trimethylolpropane tri(metha)acrylate, bis(metha)acrylamides such as methylenebis(metha)acrylamide and ethylenebis (metha)acrylamide, and unsaturated monomers having a urethane group, for example, di-(2'-methacryloxethyl)-2,4-tolylenediurethane, and a reaction product of diolmono (metha)acrylate with diisocyanate. There is no restriction for the addition amount of the photopolymerization compound. However, the addition amount is preferably from 20 to 80 weight percent of the photopolymerization-type light-sensitive compound.

Photopolymerization initiating agents can be added to the photopolymerization-type light-sensitive composition. For example, are illustrated carbonyl compounds, organic sulfur compounds, persulfur compounds, redox compounds, azo and diazo compounds, halides and photoreduction dyes described in J. Kosar, Light-Sensitive Systems, Chapter 5. Illustrative examples of the photopolymerization initiating agents are disclosed in British Patent No. 1,459,563. The photopolymerization initiating agents disclosed in the specification of said patent can be applied to the present invention.

Illustrative examples include benzophenone, Michler's ketone [4,4'-bis(dimethylamino)benzophenone], 4,4-bis (diethylamino)benzophenone, 4-methoxy-4'-dimethylaminobenzophenone, 2-ethylanthraquinone, and aromatic ketones such as the other aromatic ketone; benzoin ethers such as benzoin, benzoin metyl ether, benzoin ethyl ether an d benzoin phenyl ether; benzoins such as methylbenzoin, ethylbenzoin, etc.; 2-(o-chlorophenyl)-4,5-diphenylimidazole dimer, 2-(o-chlorophenyl)-4,5-(m-methoxyphenyl)imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer, 2-(p-methylmercaptophenyl)-4,5-diphenylimidazole dimer and 2,4,5-triacrylimidazole dimer described in U.S. Pat. No. 3,479.185, British Patent No. 1,047,569 and U.S. Pat. No. 3,784,557.

As the other photoplymerization initiating agents, thioxanthones such as 2,4-diethylthioxanthone can be employed. In this case, as the photopolymerization accelerating agents, can be employed compounds known in the art, for example, p-dimethylaminobenzoic acid isoamyl ester, p-dimethylaminobenzoic acid ethyl ester, N-methyldiethanolamine, bisdiethylaminobenzophenone, etc. There is no restriction for the addition amount of the photopolymerization initiating agents. However, the addition amount is preferably from 0.1 to 20 weight percent of the photopolymerization-type light-sensitive composition. In addition, to these photopolymerization-type light-sensitive compositions can be added diazo compounds, heatpolymerization inhibiting agents, plasticizers, etc.

Furthermore, as the other negative-type light-sensitive compounds, photobridging-type compounds can be used. As preferred examples of aforesaid photobridging compound, compounds containing a compound having a group enabling photodimerization can be illustrated.

As the compounds having a group enabling photodimerization, for example, compounds having structure represented by the formulas (4) to (11) can be illustrated.

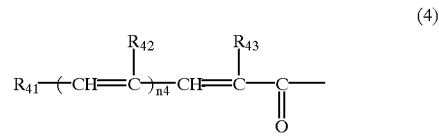

(4)

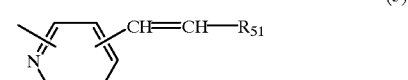

(5)

(6)

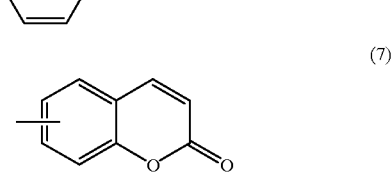

(7)

(8)

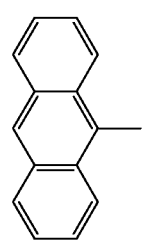

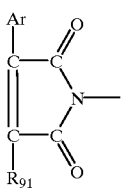
(9)

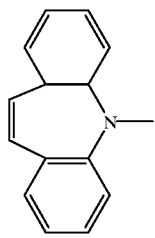
(10)

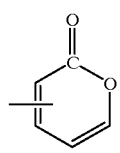
(11)

In the formulas (4) to (11), $R_{41}$, $R_{51}$ and $R_{61}$ each represent an aryl group or a heterocycle group, which may have an alkyl group having from 1 to 10 carbon atoms, an alkoxy group, a nitro group, an amino group, an alkoxycarbonyl group, an acyloxy group, an alkanoyl group, a cyano group or an azide group. $R_{42}$ in the formula (4) represents a hydrogen atom or an alkyl group having from 1 to 10 carbon atoms, and $R_{43}$ represents a hydrogen atom, an alkyl group having from 1 to 10 carbon atoms, an aryl group, an alkanoyl group or a cyano group and $n_4$ represents an integer of 0 to 5.

In the formula (9), Ar represents an aryl group and $R_{91}$ represents a hydrogen atom, a halogen atom, an alkyl group having from 1 to 10 carbon atoms or a cyano group.

As compounds having a structure represented by the formulas of (4) to (11), are included, for example, cinnamic acid esters, β-furylacrylic acid esters, α-cyanocinnamic acid esters, p-azidocinnamic acid esters, β-styrylacrylic acid esters, α-cyano-β-styrylacrylic acid esters, p-phenylenediacrylic acid esters, p-(2-benzoylvinyl)-cinnamic acid esters, β-naphtylacrylic acid esters, cinnamilidenepyruvic acid esters, α-methyl-β-styrylacrylic acid esters, α-phenyl-β-styrylacrylic acid esters, α-cyano-β-furylacrylic acid esters and α-dimethylaminocinnamic acid esters and amide, chalcone, benzilidene acetone, stilbazole, stilbene, α-phenylmaleimide, cumarine, pyrone. anthracene, or dibenzazepine corresponding to the above described esters and these derivatives. The compounds having a group enabling photodimeization are used individually or in combination of 2 or more upon mixing.

To photobridging compounds are added preferably sensitizers other than the compound having a group enabling photodimerization. Illustrative examples of said sensitizer include 2,4,7-trinitro-9-fluorenone, 5-nitroacenaphthene, p-nitrodiphenyl, p-nitroaniline, 2-nitrofluorenone, 1-nitropyrene, N-acetyl-4-nitro-1-naphthylamine, N-benzoyl-4-nitro-1-naphthylamine, Michler's ketone, N-butylacrodone, 5-benzoylacenaphthene, 1,8-phthaloylnaphthaline, 1,2-benzanthracene, 9,10-phenanthraquinone, chlorbenzanthrone, N-phenylthioacridone, 1,2-benzanthraquinone, N-methyl-2-benzoylmethylene-β-naphthothiazole, 2-chlorthioxanthone, 2,4-dimethylthioxanthone, 2,4-diisopropylthioxanthone, eosin, erystothine, picremide, etc. Application of these sensitizers is not indispensable. However, they are used to increase the efficiency of light utilization at long wavelength.

Light-sensitive compounds applied to said negative-type light-sensitive composition are used individually or in combination.

As the light-sensitive compounds composing of the positive-type light-sensitive composition, quinonediazide compounds are employed. Condensation products are preferably used which are prepared by the condensation of any of 1,2-benzoquinoediazido-4-sulfonyl chloride, 1,2-naphthoquinonediazido-4-sulfonyl chloride, 1,2naphthpquinonediazido-5-sulfonyl chloride, 1,2-naphthoquinonediazido-6-sulfonyl chloride, etc. with a compound having hydroxy groups and/or amino groups.

As the compounds having hydroxy groups, are illustrated trihydroxybenzophenone, dihydroxyanthraquinone, bisphenol A, a phenol novolak resin, a resorcine-benzoaldehyde condensation resin, a pyrogallol-acetone condensation resin. As the compounds having amino groups, are illustrated aniline, p-aminodiphenylamine, p-aminobenzophenone, 4,4'-diaminodiphenylamine, 4,4'-diaminobenzophenone, etc. As the compound having hydroxy groups, phenols and esterificated compounds with a condensation resin with aldehyde or ketone are preferably used.

As the phenols, for example, are listed monohydric phenols such as listed phenol, o-, m-, p-cresol, 3,5-xylenol, carbachlor, tymol, and dihydric phenols such as catechol, resorcine, hydroquinone, etc. and trihydric phenols such as furorogrucine.

As aldehyes, are listed formaldehyde, benzaldehyde, acetoaldehyde, crotonaldehyde, furfural, etc. Among these, formaldehye and benzaldehyde are preferable. In addition, as ketones, there are acetone, methyl ethyl ketone and the like.

As illustrative examples of condensation polymerization resins, are included a phenol-forlaldehyde resin, a p-cresol-formaldehyde resin, a m-cresol-formaldehyde resin, a mixture of m-, a p-cresol-formaldehyde resin, a resorcine-benzaldehyde resin, a pyrogallol-acetone resin, etc.

As above-mentioned quinonediazide compounds, are illustrated compounds described in Japanese Patent Publication Open to Public Inspection No. 43451/19834, for example, 1,2-quinonediazide compounds such as 1,2-benzoquinonediazide sulfonate, 1,2-naphthoquinonediazide sulfonate, 1,2-benzoquinonediazide sulfonic acid amide, described in J. Kosar, Light-Sensitive Systems, 1965, John Wiley & Sons, New York, W. S. De. Forest, Photoresist Vol. 50, 1975, McGraw-Hill, New York, Matsunaga, Inui, Kankosei Kobunshi (Light-Sensitive Polymers), Kodansha, 1977.

Examples include 1,2-benzoquinoediazido-4-sulfonic acid phenyl ester, 1,2-naphthoquinoediazido-5-sulfonic acid-2,4-dihydroxybenzophenone ester, 1,2-naphthoquinoediazido-5-sulfonic acid-2,3,4-trihydroxybenzophenone ester, a condensation product of 2 moles of 1,2-naphthoquinoediazido-5-sulfonic acid chloride with 1 mole of 4,4'-diaminobenzophenone, a condensation product of 2 moles of 1,2-naphthoquinonediazido-5-sulfonic acid chloride with 2 moles of 4,4'-dihydroxy-1,1'-diphenylsulfone and 1,2-quinonediazide compounds. Furthermore, can be illustrated 1,2-quinonediazide compounds described in Japan Patent Publication Nos. 1953/

1962, 3672/1962, 13109/1962, 26126/1965, 3801/1965, 5604/1970, 27345/1970, 13013/1976, Japanese Patent Publication Open to Public Inspection Nos. 96575/1973, 63802/1973, 63803/1973.

Among the above-mentioned quinonediazido compounds, quinonediazido esters which are prepared by the condensation reaction of 1,2-naphthoquinonediazido-4-sulfonyl chloride with a compound having hydroxy groups are particularly preferable. As quinonediazido compounds, the above-described compounds are used each individually or in combination of 2 or more. An addition amount of the quinonediazide compounds is preferably from 2 to 70 weight percent of the light-sensitive composition and more preferably from 5 to 60 weight percent.

Binders can be incorporated in the light-sensitive composition. As the binders, various polymers can be used. Details of the binders are described in U.S. Pat. No. 4,072,527. The binders includes, for example, a polyester resin, a copolymer of vinyl chloride and vinyl acetate, an acryl resin, a vinyl chloride resin, a polyamide resin, a polyvinylbutyral resin, an epoxy resin, an acrylate copolymer, a vinyl acetate copolymer, a phenoxy resin, a polyurethane resin, a polycarbonate resin, an unvulcanized rubber, a polyether, a polyamide, a urea resin, an alkid resin, a melamine resin, a gum rosin, a polyterpene, a cumarone-indene resin, polyacrylonitrilebutadine, polyvinyl acetate, a liophilic high molecular compound having a hydroxy group (for example, monomer having aliphatic hydroxy group at the side chain, e.g. a copolymer of 2-hydroxyethylacrylate or 2-hydroxyethylmethacrylate, etc. with a monomer which can copolymerize with the above monomer), a monomer having an aromatic hydroxy group (for example, a copolymer of N-(4-hydroxyphenyl)acrylamide, N-(4-hydroxyphenyl)methacrylamide, o-, m- or p-hydroxystyrene, o-, m- or p-hydroxyphenylmethacrylate) with a monomer which can copolymerize with the above monomer, a polymer having hydroxyethylacrylate or hydroxyethylmethacrylate as a repeating unit, a natural resin such as shellac, rosin, etc., polyvinyl alcohol, a polyamide resin, a linear polyurethane resin, a phthalated polyvinyl alcohol resin, cellusose derivatives such as cellulose acetate, cellulose acetate-phthalate, etc., an epoxy resin prepared by condensation of bisphenol A with epichlorhydrine, and an alkali-soluble resin (for example, a novolak resin, a vinyl polymer having a phenolic hydroxy group, and a condensation resin of a polyhydric phenol with aldehyde or ketone) and the like. The above-mentioned novolak resin includes, for example, a phenol-formaldehyde resin, a cresol-formaldehyde resin, a copolymer of phenol, cresol and formaldehyde and a copolymer of para substituted phenol and phenol or cresol and aldehyde.

As the binder incorporated in the light-sensitive composition, are preferably used a high molecular compound having, in the molecular structure, a structure unit of a vinyl carbonate monomer represented by X.

X

R—COO—CH=CH$_2$ wherein:

R represents a substituted or unsubstituted alkyl group having from 1 to 17 carbon atoms.

Any structure of high molecular compounds may be employed, if a structure unit from a monomer of vinyl carboxylate represented by the formula X is contained in the molecular structure. Preferred vinyl carboxylates represented by the formula X are as follows.

| 1 | Vinyl acetate | $CH_3COOCH=CH_2$ |
| 2 | Vinyl propionate | $CH_3CH_2COOCH=CH_2$ |
| 3 | Vinyl butyrate | $CH_3(CH_2)_2COOCH=CH_2$ |
| 4 | Vinyl pivalate | $(CH_3)_3CCOOCH=CH_2$ |
| 5 | Vinyl caprorate | $CH_3(CH_2)_4COOCH=CH_2$ |
| 6 | Vinyl caprirate | $CH_3(CH_2)_6COOCH=CH_2$ |
| 7 | Vinyl caprate | $CH_3(CH_2)_8COOCH=CH_2$ |
| 8 | Vinyl laurate | $CH_3(CH_2)_{10}COOCH=CH_2$ |
| 9 | Vinyl myristate | $CH_3(CH_2)_{12}COOCH=CH_2$ |
| 10 | Vinyl palmitate | $CH_2(CH_2)_{14}COOCH=CH_2$ |
| 11 | Vinyl stearate | $CH_3(CH_2)_{16}COOCH=CH_2$ |
| 12 | Vinyl versatate | 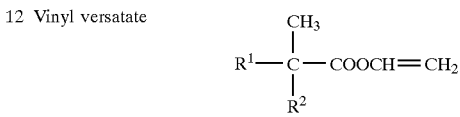 |

In the formula, $R^1$ and $R^2$ each represent an alkyl group and the total number of carbon atom is 7. The alkyl group represented by the above $R^1$ and $R^2$ may have a substituent group, for example, vinyl ester of substituted carboxylic acid.

The high molecular compounds may include a polymer prepared by the polymerization of one kind of monomers of vinyl carboxylate represented by the formula X, a polymer prepared by the copolymerization of two kinds or more of monomers of vinyl carboxylates, or a copolymer prepared by the copolymerization of monomers of vinyl carboxylate represented by the formula X with monomers which can copolymerize with the above monomer under an optional component ratio.

The vinyl carboxylate monomer represented by the formula X and the other monomers with which the above monomers are copolymerized are, for example, shown below.

(1) Ethylene-series unsaturated olefines such as ethylene, propylenen, isobutylene, butadiene, isoprene, etc.
(2) Styrenes such as styrene, α-methylstyrene, p-methylstyrene, p-chlorostyrene
(3) Acrylic acids such as acrylic acid, methacrylic acid, etc.
(4) Unsaturated aliphatic dicarboxylic acids such as itaconic acid, maleic acid, maleic acid anhydride, etc.
(5) Diesters of unsaturated dicarboxylic acid such as diethyl malate, dibutyl malate, di-2-ethylhexycyl malate, dibutyl phmalate, di-2-ethylhexcyl phmalate, etc.
(6) Esters of α-methylene aliphatic monocarboxylic acid such as methyl acrylate, ethyl acrylate, n-butyl acrylate, isobutyl acrylate, dodecyl acrylate, 2-chloroethyl acrylate, phenyl acrylate, methyl α-chloroacrylate, methyl methacrylate, ethyl methacrylate, etc.
(7) Nitriles such as acrylonitrile, methacrylonitrile, etc.
(8) Amides such as acrylamide, etc.
(9) Anilides such as acrylanilide, p-chloroacrylanilide, m-nitroacrylanilide, m-methoxyacrylanilide
(10) Vinyl ethers such as methylvinyl ether, ethylvinyl ether, isobutylvinyl ether, β-chloroethylvinyl ether, etc.
(11) Vinyl chloride, vinylidene chloride, vinylidene cyanide
(12) Ethylene derivatives such as 1-methyl-1-methoxyethylene, 1,1-dimethoxyethylene, 1,2-dimethoxyethylene, 1,1-dimethoxycarbonylethylene, 1-methyl-1-nitroethylene, etc.
(13) Vinyl monomers such as N-vinyl pyrole, N-vinyl carbazole, N-vinyl indole, N-vinyl pyrolidene, N-vinyl pyrrolidone.

The high molecular compounds particularly preferred are those which have a structure unit of vinyl acetate in the molecular structure. Among those, are preferable those which have from 45 to 95 weight percent of vinyl acetate polymerization unit, number average molecular weight (Mn) of 1,000 to 100,000, weight average molecular weight (Mw) of 5,000 to 500,000. More preferred high molecular compounds are vinyl acetate and preferably copolymers containing vinyl carboxylate having from 4 to 17 carbon atoms larger than acetic acid, preferably a copolymer containing vinyl versatate, and those which have the number average molecular weight (Mn) of 2,000 to 60,000 and weight average molecular weight (Mw) of 10,000 to 150,000 are especially preferable.

In addition, among copolymers, vinyl acetate having from 40 to 95 weight percent is specially preferable and vinyl carboxylates having more carbon atoms than acetic acid which have from 5 to 50 weight percent are particularly preferable. Furthermore, when the above-mentioned high molecular compounds are prepared, the other monomer can be used as comonomers and the comonomers can be optionally selected from the above illustrative examples.

The high molecular compounds are illustrated in accordance with the monomer component.
1 Vinyl acetate, ethylene
2 Vinyl acetate, styrene
3 Vinyl acetate, crotonic acid
4 Vinyl acetate, maleic acid
5 Vinyl acetate, 2-ethylhexcylacrylate
6 Vinyl acetate, ethylhexcylmaleate
7 Vinyl acetate, methylvinyl ether
8 Vinyl acetate, vinyl chloride
9 Vinyl acetate, N-vinyl pyrrolidone
10 Vinyl acetate, vinyl propionate
11 Vinyl acetate, vinyl pivariate
12 Vinyl acetate, vinyl versatate
13 Vinyl acetate, vinyl laurate
14 Vinyl acetate, vinyl stearate
15 Vinyl acetate, vinyl versatate, ethylene
16 Vinyl acetate, vinyl versatate, 2-ethylhexcylacrylate
17 Vinyl acetate, vinyl versatate, vinyl laurate
18 Vinyl acetate, vinyl versatate, crotonic acid
19 Vinyl propionate, vinyl versatate
20 Vinyl propionate, vinyl versatate, crotonic acid
21 Pivaric acid, vinyl stearate, maleic acid To the light-sensitive composition, in addition to each material mentioned above, are added the following additives as requried.

The additives include, for the improvement in coating properties, alkyl ethers (for example, ethyl cellulose, methyl cellulose), surface active agents of fluorine series and non-ionic surface active agents (for example, Pururonic L-64 manufactured by Asahi Denka Kokyo K.K.), plasticizers (for example, butyl phtharyl, polyethylene glycol, tributyl citrate, diethyl phthalate, dibutyl phthalate, dihexcyl phthalate, dioctyl phthalate, tricresyl phosphate, tributyl phosphate, trioctyl phosphate, tetrahydrofurfuryl oleiate, ologomer and polymer of acrylic acid or methacrylic acid) which improve the flexibility and abrasion resistance of a coated layer, ink receptive enhancing agents which improve ink receptive (for example, compound prepared by half esterification with alcohol of a copolymer of styrene and maleic acid anhydride described in Japanese Patent Application Open to Public Inspection No. 527/1965, p-tert-butylphenol formaldehyde resin and p-n-octylphenol formaldehyde resin or said resin partially esterificated by quinonediazide, stabilizers, for example, phosphoric acid, phosphorous acid, organic acids (citric acid, oxalic acid, benezenesulfonic acid, naphthalenesulfonic acid, 4-methoxy-2-hydroxybenzophenone-5-sulfonic acid, tartaric acid, etc.), development accelerators (for example, higher alcohols, acid anhydrides, etc.), inorganic powders (colloidal silica, calcium carbonate, titanium oxide) which improve shape holding properties. Furthermore, to the light-sensitive composition of the present invention are preferably added silicon oxide, aluminum oxide disclosed in U.S. Pat. Nos. 3,370,971 and 2,965,511, tertiary butyl benzoic acid, organic dye derivatives having a polar group, for example, compounds obtained by introducing a sulfonic group, a sulphoneamide group, an aminomethyl group, a phthalimi-domethyl group, etc. to the side chain of organic dye's main structure represented by Japanese Patent Publication No. 2466/1969 and U.S. Pat. No. 2,761,865 and compounds described in Japanese Patent Publication Open to Public Inspection Nos. 167761/1981, 167762/1981, 161827/1981. An addition amount of these additives is generally from 0.01 to 30 weight percent of the total solid of the light-sensitive composition, though the addition amount is subject to the application purpose.

The light-sensitive composition is prepared by the procedure wherein light-sensitive materials such as said quinonediazide compound, photopolymerization-type and/or photobridging-type compound, diazo and/or azide compound together with a binder and additives are dissolved into said organic solvent to prepare a light-sensitive solution and then, the resulting light-sensitive solution is added to said colorant dispersion. When preparing the light-sensitive composition by adding the light-sensitive solution to the colorant dispersion, the compounds of the present invention are preferably added at the preparation of the colorant dispersion. Furthermore, the light-sensitive composition can be prepared by dissolving, at the same time, and dispersing the compound of the present invention, colorant, light-sensitive compound, binder and additives.

(D)Light-sensitive Material for Color Proofs

The light-sensitive composition is employed, for example, to prepare a light-sensitive material for a color proofs (also termed image-forming material), in which a light-sensitive layer is provided by coating said light-sensitive composition as a coating solution on a support. As a coating method for coating the light-sensitive composition on a support, is used any of those known in the art, for example, rotary coating, wire bar coating, dip coating, air knife coating, spray coating, electrostatic air spray coating, roll coating, blade coating, curtain coating, etc.

The thickness of the light-sensitive layer can be decided in accordance with intended optical density, and kind and containing ratio of a colorant incorporated in the light-sensitive layer. Within tolerance, the decrease in the thickness increases the resolving power and results in good image quality. According to the foregoing, the thickness of the layer is set at a dried coating amount of 0.1 to 5 g/m$^2$.

Any material can be applied to a support composing the image-forming material. When exposure to the back side is required, a transparent support is employed. As the support, polyester film, especially poly(ethylene terephthalate) film, furthermore biaxially stretched poly(ethylene terephthalate) film is preferable for the dimension stability against water and heat. In addition, can be preferably used acetate film, polyvinyl chloride film, polystyrene film, polypropylene film, polycarbonate film and polyimide film. The surface of these supports is preferably subcoated in order to improve coating properties of the light-sensitive layer and adhesion of the same. In addition, on the front or back side of the support, an antihalation layer comprising dye and pigment may be provided for preventing the halation. Furthermore, the reverse side of the support against the side on which the light-sensitive layer is provided preferably carries matte surface for the purpose of improving slip properties as a recording material and contacting properties for a draft at exposure. Furthermore, back coating layers are preferably provided on the light-sensitive layer and the reverse side surface of the support. The back coating layer is formed using a silicone resin and the like.

In the present invention, a heat-softening releasing layer is preferably provided on the surface of the support. In the present invention, the heat-softening releasing layer is a general term for a layer which works as a heat-softening layer and/or a layer which works as a releasing layer. Furthermore, it refers to a whole means which is provided so that when a colored image formed on the support is transferred to a image-receiving material, said colored image is easily peeled off. Concept includes, for example, a means to enable easily said peeling due to heat softening, a mean to enable easily said peeling and deformation corresponding to the unevenness of the image receiving layer of the image receiving material and pushing the transferred layer into the unevenness of the image receiving material (termed heat-softening layer), and includes a layer (termed releasing process layer) formed by applying the releasing process to the surface of the support using a releasing agent.

The image-forming material is used in the process wherein an image is transferred to an image receiving layer. In this case, in order to transfer efficiently the image to the image receiving layer and enable easy peeling of the support after the image transfer, that is, to enhance the releasing properties between the support and the light-sensitive layer formed on the image-forming material, said releasing layer is preferably provided on the surface of the support.

It is possible to make a structure such that on a support, a releasing layer composed of a heat-softening layer is provided and on this layer, a colored light-sensitive layer is provided. On the releasing layer, the releasing process layer is preferably provided. The heat-softening layer is composed of, for example, a copolymer of vinyl acetate and ethylene, and the like.

The releasing process layer can be prepared by, for example, a silicone resin, a fluorine contained resin, a copolymer of polyethylene, polypropylene and α-olefine, a copolymer of propylene and α-olefine, a copolymer of ethylene and propylene, a copolymer of ethylene, propylene and diene, a copolymer of ethylene and acrylic acid, a copolymer of ethylene and vinyl acetate, an ionomer resin, wax, nylon, a polyamide resin such as copolymer nylon, etc. In addition, a melamine resin and a polyacrylic acid ester urethane resin are used to which a silicone resin and a fluorine contained resin are added. Furthermore, polypropylene film and polyethylene film, etc. show good releasing properties without making special releasing treatment. Accordingly, as a preferred state, a polypropylene or polyethylene layer which is thinner than the support is provided and used as the releasing layer. Methods for providing a polypropylene or polyethylene layer on the support include so called dry laminating method, a hot-melt laminating method, an extrusion laminating method and a joint extrusion method. The thickness of said releasing process layer is preferably from 0.01 to 30 $\mu$m and most preferablly from 0.1 to 5 $\mu$m.

The heat-softening layer becomes soft at a temperature of heat transfer and is prepared using a thermoplastic resin. The thermoplastic resin having a softening point of −30 to 20° C. is preferable. The softening point temperature in the present invention is expressed by a VICT softening point or a ring and ball method. In the present invention, are preferably illustrated, for example, polyolefines such as polyethylene, polypropylene, etc.; ethylene copolymers such as ethylene and vinyl acetate, ethylene and acrylate, and ethylene and acrylic acid; vinyl chloride copolymers such as polyvinyl chloride, vinyl chloride and vinyl acetate; polyvinylidene chloride; vinylidene chloride copolymer; styrene copolymer such as polystyrene, styrene and maleic acid anhydride; polyacrylate, polyester resin; polyurethane resin; acrylate copolymers such as acrylate and vinyl acetate; methacrylate copolymers such as polymethacrylate, methylmethacrylate and vinyl acetate, methylmethacrylate and acrylic acid; polyvinyl acetate, vinyl acetate copolymers; vinyl butyral resins; polyamide resins such as nylon, coplymer nylon, N-alkoxymethyl nylon; synthetic rubber, petroleum resins, chlorinated rubber, polyethylene glycol, polyvinylalcohol hydrogenphthalate, cellulose derivatives, cellulose acetate-phthalate, cellulose acetate-succinate, shellak, wax and the like.

The heat-softening layer is provided on a support. For example, any of the above resins for the softening layer formation is dissolved into an organic solvent or is dispersed to prepare emulsion or dispersed to form water based latex. The resulting solution or emulsion is coated on a support. The thickness of the heat-softening layer is preferably from 1 to 50 $\mu$m and most preferably from 5 to 30 $\mu$m.

Said releasing process layer can be provided on the heat-softening layer. As a method, said resin for forming the releasing process layer is dissolved into an organic solvent or is dispersed to form emulsion and the resulting solution or emulsion is coated on the heat-softening layer. In the other method, polypropylenen film or polyethylenene film is laminated on the heat-softening layer.

In addition, a protective layer may be applied to the image-forming material. It is preferable that the protective layer is dissolved or dispersed into a developing solution during development. Besides this, it is peeled off after image-wise exposure. As materials for preparing the protective layer, in practice, polyvinyl alcohol and cellulose derivatives can be illustrated. The gas permeability of the protective layer is properly controlled in accordance with kinds of light-sensitive compound used. For example, when using a gas-generating compound at exposure such as o-quinonediazide, it is preferred to provide the protective layer having high gas permeability to dissipate the generated gas, while as a photopolymerization-type light-sensitive material when image formation is retarded by oxygen in air it is preferable to use the material which forms the protective layer having low gas permeability.

The thickness of the protective layer is from about 0.01 to about 5 $\mu$m and preferably from 0.03 to 1 $\mu$m, upon considertng of the effect of the protective layer and influences of the developer. In addition, it is possible to prepare the protective layer using film sheet which is peeled off and removed before use or during use. The film sheet includes, for example, a polyethylenee film, a polypropylene film, a poly(ethylene terephthalate) film. The preferred thickness of the film depends on the film material and is preferably from 5 to 100 $\mu$m from an operational and economic point of view.

With use of the light-sensitive material for a color proofs, a color image is prepared as follows. The light-sensitive material is exposed through a transparent original having a line image, halftone image, etc. and is developed by a developer. A negative or positive relief image corresponding to the original is obtained. Then, a color image is obtained by transferring the resulting relief image to an image-receiving material. Light sources for actinic light suitable for exposure include a carbon arc, a mercury lamp, a xenon lamp, a chemical lamp, a metal halide lamp, an electronic flash, and the like.

For the application to a multicolor image-forming method, the following method is presented as basic one. A first color image is prepared on a first color image forming material having a color image-forming layer for the first color image on a support, and the color image is transferred to an image-receiving material and the support is peeled off. Furthermore, a second color image is formed on a second color image-forming material and the resulting second color image is transferred to the first color image and the support is peeled off, while a register mark on the first color image is put on a register mark on the second color image. With use of the same procedure, a third color image and a forth color image each are transferred to the image-receiving material and the multicolor image is usually obtained. In some cases, the resulting multicolor image is indirectly transferred to the image-receiving material and the multicolor image is obtained. Such methods are disclosed in Japanese Patent Publication Open to Public Inspection Nos. 41830/1972, 97140/1984, 28649/1985, U.S. Pat. No. 3,775,113 and the like.

The image-receiving materials can include, for example, fiber-based materials such as paper, polyethylene-laminated paper, polypropylene-laminated paper, cloth, etc.; metal sheets and foil such as aluminum, copper, magnasium, zinc, etc.; synthetic polymer materials such as polyalkylmethacrylate, for example, methylmethacrylate, polyester film base, for example, poly(ethylene terephthalate), polyvinyl acetal polyamide, for example, nylon, cellulose ester film base, for example, cellulose nitrate, cellulose acetate, cellulose acetate propionate and cellulose acetate butylate.

The image-forming material is developed by a developer which has a developing function to develop a material to be processed. A preferred example of the developer is an alkaline aqueous developer. Alkali agents employed in the developer and its replenisher include preferably organic alkali compounds and organic ammonium silicates such as sodium silicate, potassium silicate, sodium hydroxide, lithium hydroxide, sodium tertiary phosphate, sodium secondary phosphate, potassium tertiary phosphate, potassium secondary phosphate, ammonium tertiary phosphate, ammonium secondary phosphate, sodium metasilicate, sodium bicarbonate, sodium carbonate, potassium carbonate and ammonium carbonate. Among these, silicates are preferable and alkali metal silicates are most preferable. An addition amount of the alkali agent in the developer is preferably from 0.05 to 20 weight percent and more preferably from 0.1 to 10 weight percent.

To the developer can be added additives such as organic solvents, water-soluble reducing agents, surface active agents, and chelating agents. The organic solvents include, for example, carboxylic acid esters such as ethyl acetate, propyl acetate, butyl acetate, amyl acetate, benzyl acetate, ethylene glycol monobutyl acetate, butyl lactate and butyl levulinate; ketones such as ethyl butyl ketone, methyl isobutyl ketone and cyclohexanone; alcohols such as ethylene glycol monobutyl ether, ethylene glycol benzyl ether, ethylene glycol monophenyl ether, benzyl alcohol, methyl phenyl carbinol, n-amyl alcohol, and methylamyl alcohol; glycols such as ethylene glycol and propylene glycol; alkyl substituted aromatic hydrocarbons such as xylene; and halogenated hydrocarbons such as methylene dichloride, ethylene dichloride and monochlorbenzene. It is possible to employ one or more organic solvents. Among these organic solvents, most preferable are ethylene glycol monophenyl ether, ethylene glycol benzyl ether, benzyl alcohol and propylene glycol.

To the developer, can add the following additives for the increase in developability. Additives include, for example, neutral salts such as NaCl, KCl, KBr, etc. described in Japanese Patent Publication Open to Public Inspection No. 75152/1983, chelating agents such as EDTA, NTA, etc. described in Japanese Patent Publication Open to Public Inspection No. 190952/1983, complexes such as $[Co(NH_3)_6]Cl_3$, etc. described in Japanese Patent Publication Open to Public Inspection No. 121336/1984, cationic polymers such as a quaternary compound of p-dimethylaminometyl polystyrene methyl chloride described in Japanese Patent Publication Open to Public Inspection No. 95946/1980, amphoteric high molecular weight electrolytes such as a copolymer of vinylbenzyltrimethyl ammonium chloride and sodium acrylate described in Japanese Patent Publication Open to Public Inspection No. 142528/1981, reducing inorganic salts described in Japanese Patent Publication Open to Public Inspection No. 192952/1982, inorganic lithium compounds such as lithium chloride described in Japanese Patent Publication Open to Public Inspection No. 59444/1983, organic lithium compounds such as lithium benzoate described in Japanese Patent Publication No. 34442/1975, organic metal surface active agents containing Si, Ti, etc. described in Japannese Patent Publication No. 75255/1984, organic boron compounds described in Japanese Patent Publication Open to Public Inspection No. 84241/1984, anion surface active agents such as higher alcohol sulfuric acid ester salts, aliphatic alcohol phosphoric acid ester salts, alkylaryl sulfonic acid salts, dibasic aliphatic ester sulfonic acid salts, alkylnaphthalene sulfonic acid salts, etc.

EXAMPLE

Explanation on the present invention is detailed by reference to the following examples wherein, unless otherwise indicated, all parts are by weight.

Example 1

Each mixture illustrated in Table 1 below was put in a vessel for dispersion equipped with a water cooling dacket. After putting glass beads having a diameter of 2 mm in the vessel, a stirring disk was installed. Then, dispersion was carried out for 4 hours at 2,000 rpm and solid dispersions (hereinafter, referred to as Sample) 1 to 6 were prepared.

TABLE 1

| No. | Solid (Part) | Compound of Present Invention | | Solvent | | Other Additive | |
|---|---|---|---|---|---|---|---|
| | | Compound | (Part) | Compound | (Part) | Compound | (Part) |
| 1 | 30 | Example 17 | 6 | MEK | 64 | | |
| 2 | 30 | Example 17 | 4.5 | MEK | 62.5 | Copper phthalocyanine disulfonic acid | 1.1 |
| 3 | 30 | Example 18 | 6 | MEK | 62.5 | Copper phthalocyanine disulfonic acid | 1.5 |

31

TABLE 1-continued

| No. | Solid (Part) | Compound of Present Invention Compound | (Part) | Solvent Compound | (Part) | Other Additive Compound | (Part) |
|---|---|---|---|---|---|---|---|
| 4 | 30 | Example 19 | 6 | MEK | 64 | | |
| 5 | 30 | Example 19 | 6 | MEK | 64 | | |
| 6 | 30 | — | — | MEK | 70 | | |

MEK: methyl ethyl ketone
*1: Carbon Black MA-100 manufactured by Mitsubishi Chemical Corp.

The resulting Samples 1 to 6 were left alone for one day solid sedimentation was checked. Then, solid particle diameters of the Samples 1 to 5 were measured by the Series 7032 Multi-8 Correlator manufactured by MALVERN. Then, the Samples 1 to 5 were put in tight-sealed vessels and were left alone. After 1, 2, 3 and 6 months, the solid particle diameter of each Sample was measured. The results are as follows.

TABLE 2

| Sample No. | 1 Day Sedimentation | Diameter (nm) | 1 Month (nm) | 2 Months (nm) | 3 Months (nm) | 6 Months (nm) |
|---|---|---|---|---|---|---|
| 1 | None | 154 | 154 | 152 | 155 | 162 |
| 2 | None | 150 | 150 | 152 | 151 | 153 |
| 3 | None | 155 | 153 | 155 | 154 | 157 |
| 4 | None | 165 | 164 | 165 | 170 | 173 |
| 5 | None | 155 | 157 | 155 | 159 | 163 |
| 6 | Present | — | — | — | — | — |

The results obtained show that Samples 1 to 5 of the present invention have small variation in particle diameters and the degree and stability of the dispersion are excellent. As for the Sample 6, the solid (carbon black) perfectly fell down to form 2 layers. It is found that the Sample 6 cannot be put into practice.

32

Example 2

Each mixture shown in Table 3 was put in a vessel equipped with a water cooling jacket and after glass beads having a dimameter of 1 mm were added, a stirring disk was installed. Then, dispersion was carried out for 5 hours at 2,000 rpm and Samples 7 to 11 were prepared.

TABLE 3

| No. | Solid (Part) | Compound of Present Invention Compound | (Part) | Solvent Compound | (Part) | Other Additive Compound | (Part) |
|---|---|---|---|---|---|---|---|
| 7 | 10 | Example (1)-21 | 2 | MEK | 88 | | |
| 8 | 10 | Example (1)-21 | 2 | MEK | 87.5 | Compound 1 | 0.5 |
| 9 | 10 | Example (1)-22 | 1.6 | MEK | 88 | Compound 1 | 0.4 |
| 10 | 30 | Example (1)-23 | 2 | MEK | 88 | | |
| 11 | 30 | — | — | MEK | 90 | | |

*2: Seika Fast Yellow H7055 manufactured by Dainichiseika Colour & Chemicals Mfg. Co., Ltd.

Compound 1

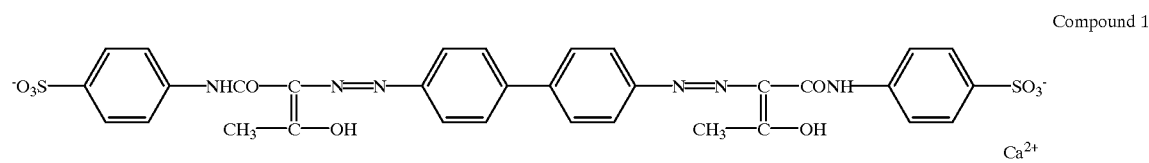

$Ca^{2+}$

The resulting Samples 7 to 11 were left alone for one day and each solid sedimentation was checked. Then, solid particle diameters of Samples 7 to 11 were measured by the same equipment used in Example 1. Furthermore, Samples 7 to 11 each were put into a tight-sealed vessel and the solid particle diameters were measured after 1, 2, 3 and 6 months. The results are as follows.

TABLE 4

| Sample No. | 1 Day Sedimentation | Diameter (nm) | 1 Month (nm) | 2 Months (nm) | 3 Months (nm) | 6 Months (nm) |
|---|---|---|---|---|---|---|
| 7 | None | 220 | 222 | 218 | 222 | 228 |
| 8 | None | 210 | 208 | 211 | 215 | 212 |
| 9 | None | 215 | 217 | 215 | 218 | 213 |
| 10 | None | 227 | 226 | 230 | 228 | 235 |
| 11 | Present | — | — | — | — | — |

The results obtained show that Samples 7 to 10 of the the present invention are excellent in the degree and stability of the dispersion. As for the Sample 11 (yellow pigment) the solid perfectly fell down to form 2 layers. It is found that the Sample 11 cannot be put into practice.

Example 3

Samples 12 to 21 were prepared and each of sedimentation was checked after leaving them alone for 3 month in a tight-vessel. The results are shown in Table 5.

TABLE 5

| No. | Solid Compound | Quantity | Compound of Present Invention (Part) | Quantity | Organic Solvent | Sedimentation after 3 months | Other Additive Quantity | (Part) |
|---|---|---|---|---|---|---|---|---|
| 12 | ε-type Copper phthalocyanine | 30 parts | Compound (1)-24 | 4 parts | MEK | None | | |
| 13 | β-type Copper phthalocyanine | 30 parts | Compound (1)-25 | 4 parts | MEK | None | Copper phthalocyanine disulfonic acid | 1 |
| 14 | Brilliant Carmin 6B | 20 parts | Compound (1)-25 | 3 parts | MEK | None | | |
| 15 | Acid-processed carbon black | 30 parts | Compound (1)-24 | 4.5 parts | MEK | None | Copper phthalocyanine trisulfonic acid | 1 |
| 16 | Unprocessed Carbon black | 30 parts | Compound (1)-25 | 6 parts | MEK | None | | 1 |
| 17 | ε-type Copper phthalocyanine | 40 parts | Compound (1)-26 | 5 parts | MEK | None | | |
| 18 | Wochan Red B | 20 parts | Compound (1)-26 | 3 parts | MEK | None | | |
| 19 | C.I. Pigment Red 122 | 15 parts | Compound (1)-25 | 4.3 parts | MEK | None | | |
| 20 | C.I. Pigment Red 176 | 15 parts | Compound (1)-24 | 4.3 parts | MEK | None | | |
| 21 | C.I. Pigment Yellow 12 | 10 parts | Compound (1)-27 | 1.5 parts | MEK | None | Compound 1 | 0.5 |

MEK: methyl ethyl ketone
MIBK: methyl isobutyl ketone

Solid dispersions of the present invention result in no sedimentation after being left alone for three months in a sealed vessel and are excellent in the least variation during storage.

Example 4

A light sensitive composition K-1 is prepared with the following compounds.

| | |
|---|---|
| QD-1 | 1.7 parts |
| 50 weight percent methanol solution of copolymer (Mw = 60,000) of vinyl acetate and vinyl versatate (80:20 in weight part) | 11.5 parts |
| 50 weight percent methanol solution of copolymer (Mw = 60,000) of vinyl acetate, vinyl versatate and crotonic acid (79:20:1 in weight part) | 10 parts |
| Methyl ethyl ketone | 68 parts |

QD-1

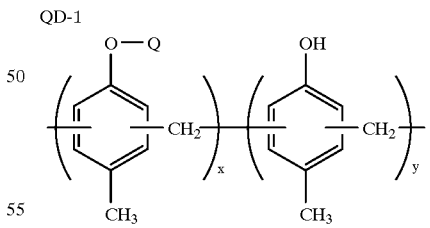

Q:

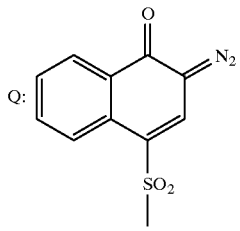

X:Y = 1:1 Resin before Q undergoes reaction has Mw = 500.

To 4.5 parts of the Sample 3 prepared in Example 1, 4.5 parts of methyl ethyl ketone was added with stirring. After confirming that the resulting solution became homogeneous enough, 91 parts of the light-sensitive solution K-1 was added with stirring and a light-sensitive composition K-1 was prepared.

The particle diameter of the light-sensitive composition K-1 was measured by the same method as in Example 1 and 158 nm was obtained. No appreciable change in dispersion was observed compared to that in which only solid was dispersed.

Example 5

Preparation of Coating Solution K-21

A pigment dispersion K-21 and a light-sensitive solution K-21 were prepared as follows.

| (Pigment Dispersion K-21) | |
|---|---|
| Carbon black Printex 25, manufactured by Degussa Co. | 30 parts |
| 50 weight percent methanol solution of copolymer (Mw = 60,000) of vinyl acetate and vinyl versatate (80:20 in weight part) | 120 parts |
| Methyl ethyl ketone | 90 parts |

In addition to the above mixture, 360 parts of glass beads having a diameter of 2 mm were put in a vessel for dispersion equipped with a water cooling jacket. After a stirring disk was installed, dispersion was carried out for 4 hours at 2,000 rpm. Then, with stirring, the following compositions were added and the pigment dispersion K-21 was prepared.

| | |
|---|---|
| 50 weight percent methanol solution of said copolymer of vinyl acetate and vinyl versatate | 105 parts |
| Methyl ethyl ketone | 405 parts |
| (Light-sensitive Solution K-21) | |
| QD-1 | 2 parts |
| 50 weight percent methanol solution of said copolymer of vinyl acetate and vinyl versatate | 1.5 parts |
| 50 weight percent methanol solution of copolymer (Mw = 60,000) of vinyl acetate, vinyl versatate and crotonic acid (79:20:1 in weight part) | 12 parts |
| Methyl ethyl ketone | 20 parts |

QD-1

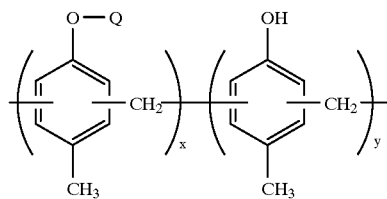

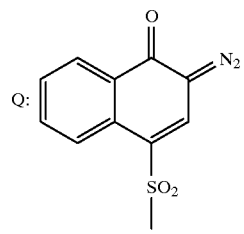

x:y = 1:1 Mw = 500, before Q undergoes reaction.

To 34 parts of the above-described pigment dispersion K-21, 30 parts of methyl ethyl ketone was added with stirring. To the resulting solution, 36 parts of the light-sensitive solution K-21 was added with stirring and a coating solution K-21 was prepared.

Preparation of Coating Solution K-22

A pigment dispersion K-22 and a light-sensitive solution K-22 were prepared as follows.

| (Pigment Dispersion K-22) | |
|---|---|
| Carbon black Printex 25 manufactured by Degussa Co. | 72 parts |
| Example Compound (1)-1 | 14.4 parts |
| Copper phthalocyanine disulfonic acid | 3.6 parts |
| Methyl ethyl ketone | 150 parts |

In addition to the above mixture, 360 parts of glass beads having a diameter of 2 mm were put into a vessel for dispersion equipped with a water cooling jacket. After a stirring disk was installed, dispersion was carried out for 4 hours at 2,000 rpm and a pigment dispersion K-22 was prepared.

| (Light-sensitive Solution K-22) | |
|---|---|
| QD-1 | 1.7 parts |
| 50 weight percent methanol solution of said copolymer of vinyl acetate and vinyl versatate | 11.5 parts |
| 50 weight percent methanol solution of said copolymer of vinyl acetate, vinyl versatate and crotonic acid | 10 parts |
| Methyl ethyl ketone | 68 parts |

To 4.5 parts of the resulting pigment dispersion K-22 4.5 parts of methyl ethyl ketone was added with stirring. After confirming that the resulting solution was homogeneous enough, 91 parts of the light-sensitive solution K-22 was added and a coating solution K-22 was prepared.

(Evaluation on Stability of Dispersion)

In a 2,000 ml beaker, 2,000 g of each of the coating solution K-21 and K-22 was put and was left alone with stirring. While compensating the decrease in weight due to the evaporation of the solvent, samples were taken every two hours. Next day, particle diameters (nm) of dispersed particles were measured. The results are as follows.

| Coating Solution | 0 Hour | 2 Hours | 4 Hours | 6 Hours | 8 Hours |
|---|---|---|---|---|---|
| K-21 | 207 | 217 | 228 | 334 | 442 |
| K-22 | 210 | 219 | 213 | 207 | 212 |

The above results show that the particle diameter of the coating solution K-22 using the light-sensitive composition of the present invention does not change with the elapse of time and has good compatibility with various materials.

Preparation of Support

Support 1 was prepared as follows. An ethylene-vinyl acetate copolymer (EVAFLEX P-1405: content ratio of vinyl acetate 14 weight percent, VICAT softening point 68° C., manufactured by Mitsui duPont Polychemical Co. was laminated at a thickness of 30 μm on polyethylene terephthalate film having a thickness of 75 μm by an extrusion laminating method.

(Evaluation on Coating properties)

The coating solutions K-21 and K-22 each were coated on the resulting support 1 using a wire bar coating device under the following conditions.

| | | |
|---|---|---|
| Pump flow rate | 30 | ml/width cm · min. |
| Coating speed (Transporting speed of support) | 10 | m/min. |
| Primary layer volume | 20 | ml/width cm · min. |
| Secondary layer thickness | 12 | μm |

Soon after coating, the coating solution K-21 caused coating streak, which was evaluated unacceptable as the product. On the other hand, the coating solution K-22 caused no coating streak and stable coating was carried out for many hours.

Preparation of Image-forming Material

On the resulting support 1, the coating solutions K-21 and K-22 each were coated at a dry layer thickness of 1.8 g/m$^2$ using a wire bar coating device and dried. The image-forming materials K-21 and K-22 were thus prepared.

(Evaluation on Sensitivity)

The resulting image-forming materials K-21 and K-22 each were exposed using the Room Light Printer P-647-GA manufactured by Dainippon Screen Mfg. Co. Ltd. An amount of exposure was decided as follows. The material was contacted with the Step Tablet for sensitometry (No. 2, 21 steps gray scale, density increment of 0.15 manufactured by Eastman Kodak Co.) and exposed using the above Bright Room Printer. Then, the exposed material was developed by the Konica Excelart Developer ED (4 times dilution)at 32° C. for 35 seconds using the Konica Excelart Processor EX900L. An amount of exposure was decided so that the 3.0 step of the above-mentioned Step Tablet became perfectly clear. The results are as follows.

| | Exposure Amount Required to Obtain Clear 3 Step |
|---|---|
| Image-forming Material K-21 | 100 |
| Image-forming Material K-22 | 84 |

The exposure amount required to obtain the clear 3 step is expressed as a relative value and the image-forming material K-21 is rated at 100. The sensitivity becomes high as the exposure amount decreases.

The above results show that the image-forming material K-22 using the light-sensitive material needs less exposure amount to obtain the clear 3 step and accordingly carries high sensitivity.

Example 6

(Preparation of Pigment Dispersions K-23 to K-26)

Pigment dispersions K-23 to K-26 were prepared in the same manner as in the pigment dispersion K-22 except that the carbon black, the compound represented by the formula (1) and others were changed as shown in Table 6.

TABLE 6

| Dispersion | Compound represented by Formula (1) | Carbon Black weight percent | Solvent weight percent | Other weight percent |
|---|---|---|---|---|
| K-23 | Example Compound (1)-2 | MA-100 manufactured by Mitsubishi Chemical Corp. | MIBK 64 | |

TABLE 6-continued

| Dispersion | Compound represented by Formula (1) | Carbon Black weight percent | Solvent weight percent | Other weight percent |
|---|---|---|---|---|
| K-24 | Example Compound (1)-3 | 30 REGAL 400R manufactured by CABOT Co. | MEK 64.2 | Copper phthalocyanine disulfonic acid |
| K-25 | Example Compound (1)-4 | 30 REGAL 330R manufactured by CABOT Co. | MEK 62 | |
| K-26 | Example Compound (1)-5 | MA-100 manufactured by Mitsubishi Chemical Corp. | MEK | Copper phthalocyanine trisulfonic acid |

MIBK: methyl isobutyl ketone
MEK: methyl ethyl ketone

Coating solutions K-23 to K-26 were prepared using the resulting pigment dispersions K-23 to K-26 with the light-sensitive solution K-22 obtained in Example 5. The dispersion stability, coating properties and sensitivity were evaluated and excellent results were obtained for each item.

Example 7

Preparation of Coating Solutions K-27 and K-28

Pigment dispersions K-27 and K-28 and a light-sensitive solution K-23 were prepared as follows.

| (Pigment Dispersions K-27 and K-28) | |
|---|---|
| Carbon black MA-100 manufactured by Mitsubishi Chemical Corp. | 72 parts |
| Example compound (1)-6 | 14.4 parts |
| Copper phthalocyanine disulfonic acid | 3.6 parts |
| Methyl ethyl ketone | 150 parts |

The above mixture was put in a vessel for dispersion equipped with a stirring disk and a water cooling jacket, and then, 360 parts of glass beads having a diameter of 1 mm was put in. Dispersion was carried out for 3.5 hours at 2,000 rpm and a pigment dispersion K-27 was prepared. In addition, a pigment dispersion K-28 was prepared by the same manner except that the compound (1)-6 was changed to a compound described in Example 11 of Japanese Patent Publication Open to Public Inspection No. 7294/1971.

| Light-sensitive Solution K-23 | |
|---|---|
| QD-1 | 2.3 parts |
| 50 weight percent methanol solution of said copolymer of vinyl acetate, and vinyl versatate | 16 parts |
| 50 weight percent methanol solution of said copolymer of vinyl acetate, vinyl versatate and crotonic acid | 7 parts |
| Methyl ethyl ketone | 65.7 parts |

To 4.5 parts of the pigment dispersion, 4.5 parts of methyl ethyl ketone was added with stirring. After confirming that the resulting solution was homogeneous enough, 91 parts of the light-sensitive solution K-23 was added with stirring and a coating solution K-27 was prepared. A coating solution K-28 was prepared in the same way.

Preparation of Image-forming Material

On the support 1 prepared in Example 5, the coating solutions K-27 and K-28 each were coated at a thickness of the dried layer of 2.0 g/m² using a wire bar coating device and dried. Thus, image-forming materials K-27 and k-28 were prepared.
(Evaluation on Sensitivity)

In the same manner as in Example 5, an exposure amount for the image-forming materials K-27 and K-28 was measured. The results are as follows.

|  | Exposure Amount Required to Obtain Clear 3 Step |
|---|---|
| Image-forming Material K-27 | 77 |
| Image-forming Material K-28 | 100 |

The exposure amount required to obtain the clear 3 step is expressed as a relative value and the image-forming material K-28 is rated at 100. The less the value becomes, the higher the sensitivity becomes.

A small exposure amount is required to obtain the clear 3 step for the image-forming material of the present invention. Accordingly the material has high sensitivity.
(Evaluation on Developability)

Image-forming materials K-27 and K-28 each were exposed at an amount corresponding to obtaining the clear 3 step and were developed at 32° C. for 35 seconds with the Konica Excelart Developer ED (4 times dilution). After development, remaining carbon black on the support of the image-forming material was observed.

The carbon black of the image-forming material K-28 was not developed and remained as looked almost black. On the contrary, the carbon black of the image-forming material K-27 was almost developed and remained a little.
(Evaluation on Image Stain)

Furthermore, the image-forming materials K-27 and K-28 each were cut to a sheet of 20 cm×40 cm. The 5 sheets for each were exposed in the same manner as the above. The exposed sheets were developed at 32° C. for 35 seconds with the Konica Excelart Developer ED (4 times dilution) manufactured by Konica Corp. using the Konica Excelart Processor EX900L manufactured by Konica Corp. Then, unexposed Konica Excelart Transfer Film EP-1Y (A1 size) was developed under the same condition. The developed EP-1Y was transferred to the Tokubishi Art Paper manufactured by Mitsubishi Paper Mills, Ltd. at 70° C. of the drum temperature and 110° C. of the pressure roller for 60 seconds of the transfer time using the above described Excelart Processor EX900L.

When the EP-1Y was developed after developing the image-forming material K-28, it was found that the transferred image was stained with the carbon black, while after developing the image-forming material K-27, it was found that the transferred image was not stained.

Example 8
Preparation of Coating Solutions M-1 and M-2

Pigment dispersions M-1 and M-2 and a light-sensitive solution M-1 were prepared as follows.

| (Pigment Dispersions M-1 and M-2) | |
|---|---|
| Lionol Red 6B FG-7219X manufactured by Toyo Ink Mfg. Co., Ltd. | 48 parts |
| Example compound (1)-7 | 7.2 parts |
| Methyl ethyl ketone | 185 parts |

The above mixture was put in a vessel for dispersion equipped with a stirring disk and a water cooling jacket, and then, 360 parts of glass beads having a diameter of 1 mm was placed. Dispersion was carried out for 4 hours at 2,000 rpm and a pigment dispersion M-1 was prepared. In addition, as for the comparison, a pigment dispersion M-2 was prepared in the same manner except that the example compound (1)-7 was replaced to a compound described in Example 11 of Japanese Patent Publication Open to Public Inspection No. 72904/1971.

| (Light-sensitive Solution M-1) | |
|---|---|
| QD-1 | 2 parts |
| 50 weight percent methanol solution of said copolymer of vinyl acetate and vinyl versatate | 20 parts |
| 50 weight percent methanol solution of said copolymer of vinyl acetate, vinyl versatate and crotonic acid | 4 parts |
| Methyl ethyl ketone | 27 parts |

Seven portions were taken from each of the resulting image-forming solutions M-1 and M-2 and 40 parts of methyl ethyl ketone was added to the portion with stirring. After confirming the resulting solution was homogeneous enough, 53 parts of the light-sensitive solution M-1 was added with stirring and coating solutions M-1 and M-2 were prepared.
Preparation of Image-forming Material On the support 1 prepared in Example 5, the coating solutions M-1 and M-2 each were coated at a thickness of the dried layer of 1.8 g/m² using a wire bar coating device and dried. Thus, the image-forming materials M-1 and M-2 were prepared.
(Measurement of Sensitivity)

In the same manner as in Example 1, an exposure amount for the image-forming materials M-1 and M-2 was measured. The results are as follows.

|  | Exposure Amount Required to Obtain Clear 3 Step |
|---|---|
| Image-forming Material M-1 | 77 |
| Image-forming Material M-2 | 100 |

The exposure amount required to obtain the clear 3 step is expressed as a relative value and the image-forming material M-2 is rated at 100. The less the value becomes, the higher the sensitivity becomes.

Example 9
Preparation of Coating Solutions C-1 and Y-1

Pigment dispersions C-1 and Y-1 were prepared as follows.

| (Pigment Dispersion C-1) | |
|---|---|
| Linol Blue FG 7400 manufactured by Toyo Ink Mfg. Co., Ltd. | 72 parts |
| Example compound (1)-8 | 14.4 parts |
| Copper phthalocyanine disulfonic acid | 3.6 parts |
| Methyl ethyl ketone | 150 parts |

The above mixture was put in a vessel for dispersion equipped with a stirring disk and a water cooling jacket, and then, 360 parts of glass beads having a diameter of 1.5 mm was placed. Dispersion was carried out for 4 hour at 2,000 rpm and a pigment dispersion C-1 was prepared.

| (Pigment Dispersion Y-1) | | |
|---|---:|---|
| Seika Fast Yellow H-7055 manufactured by Dainichiseika Colour & Chemicals Mfg. Co., Ltd. | 24 | parts |
| Example compound (1)-8 | 4 | parts |
| Methyl ethyl ketone | 211.2 | parts |
| Compound 1 | 0.8 | parts |

Except for the above, a pigment dispersion Y-1 was prepared in the same manner as the pigment dispersion C-1.

| | | |
|---|---:|---|
| 50 percent methanol solution of said copolymer of vinyl acetate and vinyl versatate | 140 | parts |
| 50 percent methanol solution of copolymer (Mw = 60,000) of vinyl acetate, vinyl versatate and stearic acid (copolymerization ratio = 80:15:5 in weight part) | 12 | parts |
| Methyl ethyl ketone | 765 | parts |

Compound 1

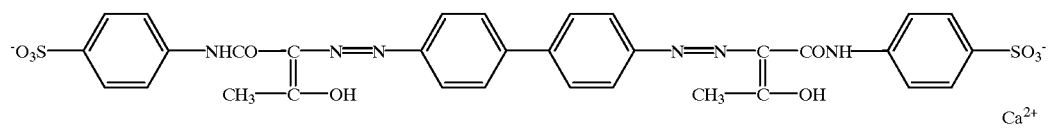

To 4.5 parts of the resulting pigment dispersion C-1, 4.5 parts of methyl ethyl ketone was added with stirring. After confirming that the resulting solution became homogeneous enough, 91 parts of the light-sensitive solution K-23 obtained in Example 7 was added with stirring and a coating solution C-1 was prepared. Furthermore, to 14 parts of the pigment dispersion Y-1, 33 parts of methyl ethyl ketone was added with stirring. After confirming that the resulting solution became homogeneous enough, 53 parts of the light-sensitive solution M-1 prepared in Example 8 was added with stirring and a coating solution Y-1 was prepared.
(Evaluation on Coating Properties)

The coating properties of the resulting coating solutions C-1 and Y-1 were checked in the same manner as in Example 1. It was found that both solutions caused no coating streak and showed stable coating for a long period of hours.
Preparation of Image-forming Material On the support 1 obtained in Example 5, the coating solutions C-1 and Y-1 each were coated at a dry layer thickness of 2.0 g/m² and dried. Image-forming materials C-1 and Y-1 were thus prepared.
(Evaluation on Developability)

In the same manner as in Example 5, the image-forming materials C-1 and Y-1 each were exposed. The exposed materials were developed by the above-mentioned Konica Excelart Developer ED (4 times dilution)at 32° C. for 35 seconds. After development, the remaining pigment on the support was visually observed. It was found no remaining pigment was observed for both image-forming materials C-1 and Y-1 and the pigment was almost developed to remain a little on the support.

Example 10

Preparation of Coating Solution K-29

A coating solution K-29 comprising the following composition was prepared.

| | | |
|---|---:|---|
| Carbon black Regal 400R manufactured by CABOT Co. | 20 | parts |
| Example compound (1)-10 | 4 | parts |
| Copper phthalocyanine disulfonic acid | 1 | part |
| Michler's ketone | 0.4 | part |
| Benzophenone | 2.5 | parts |
| Pentaerythritol tetracrylate | 60 | parts |

Together with 240 parts of the above composition, 360 parts of glass beads having a diameter of 1 mm was put in a vessel for dispersion equipped with a water cooling jacket. After installing a stirring disk, dispersion was carried our for 4 hours at 2,000 rpm and a coating solution K-29 was prepared.
Evaluation on Coating Properties The coating properties of the resulting coating solution K-29 were checked using the same device used in Example 5. It was found that no coating streak was caused and stable coating was possible for a long period of hours.
Preparation of Image-forming Material K-29

On the above-mentioned support 1, the coating solution K-29 was coated at a dry layer thickness of 2 g/m² using a wire bar coating device and dried. The resulting light-sensitive layer was laminated with polyethylene terephthalate film having a thickness of 15 μm. Thus, an image-forming material K-29 was prepared.
Evaluation on Developability After peeling off the cover sheet of the resulting image-forming material K-29, the material was developed at 32° C. for 30 seconds with the Konica Excelart Developer ED (4 times dilution)manufactured by Konica Corp. and the light-sensitive layer was removed during development. No remaining carbon black on the support of the image-forming material K-29 was found.

With use of a compound represented by the formula (1), is obtained a light-sensitive composition having excellent dispersing properties for a colorant and dispersion stability. In addition, a color proofs prepared by coating said light-sensitive composition on a support has excellent developability and high sensitivity. Moreover, the coating properties are improved.

Example 11

Each mixture shown in Table 7 was put in a vessel for dispersion equipped with a water cooling jacket and glass beads having a diameter of 2 mm were added. After installing a stirring disk, dispersion was carried out for 4 hours at 2,000 rpm and solid dispersion compositions 31 to 38 were prepared. These were termed pigment dispersions 31 to 38. The solid dispersion composition 38 is a mixture dispersion of (2)-3 and (3)-1.

TABLE 7

| Pigment Disper-sion | Solid part | Compound of Present Invention Example | part | Solvent Name | part | Other Additive Name | part |
|---|---|---|---|---|---|---|---|
| 31 | 30 | (2)-1 | 8 | MEK | 62 | | |
| 32 | 30 | (2)-2 | 6 | MEK | 64 | | |
| 33 | 30 | (2)-3 | 6 | MEK | 62.5 | Copper phthalocyanine disuldonic acid | 1.5 |
| 34 | 30 | (2)-4 | 6 | MEK | 62.5 | Copper phthalocyanine disuldonic acid | 1.5 |
| 35 | 30 | (2)-5 | 9 | MEBK | 61 | | |
| 36 | 30 | (2)-6 | 7.5 | MEBK | 61 | | |
| 37 | 30 | (3)-1 | 6 | MEK | 62.9 | Copper phthalocyanine trisulfonic acid | 1.1 |
| 38 | 30 | (2)-3 (3)-1 | 4 2 | MEK | 62.5 | Copper phthalocyanine disuldonic acid | 1.5 |

MEK: methyl ethyl ketone
MIBK: methyl isobutyl ketone

⋇: Carbon Black MA-100 manufactured by Mitsubishi Chemical Corp.

The resulting pigment dispersions 31 to 38 were left alone for one day and then, the sedimentation of each pigment was checked. Furthermore, the particle diameter of each pigment of the pigment dispersions 31 to 38 was measured by the Series 7032 Multi-8 Correlator manufactured by MALVERN. Then, each of said pigment dispersions 31 to 38 was put in a tight-sealed vessel and was left alone. After the elapse of 1, 2, 3 and 6 months, each diameter was measured. The results are as follows.

TABLE 8

| Pigment Dispersion | Sedimentation | Particle Diameter (nm) | | | | |
|---|---|---|---|---|---|---|
| | | Next Day | After 1 Month | 2 Months | 3 Months | 6 Months |
| 31 | None | 165 | 168 | 162 | 164 | 170 |
| 32 | None | 160 | 163 | 162 | 167 | 165 |
| 33 | None | 615 | 153 | 155 | 154 | 150 |
| 34 | None | 167 | 170 | 165 | 170 | 172 |
| 35 | None | 156 | 157 | 155 | 159 | 162 |
| 36 | None | 161 | 163 | 166 | 165 | 165 |
| 37 | None | 168 | 171 | 173 | 167 | 172 |
| 38 | None | 158 | 160 | 165 | 162 | 160 |

The results obtained show that the pigment dispersions 31 to 38 of the present invention have small variation in the particle diameter and excellent in dispersion properties and stability.

Example 12

Each mixture shown in Table 9 was put in a vessel for dispersion equipped with a water cooling jacket and then, glass beads having a diameter of 1 mm were added. After installing a stirring disk, dispersion was carried out for 5 hours at 2,000 rpm and pigment dispersions 41 to 45 were prepared.

TABLE 9

| Pigment Dispersion | Solid part | Compound of Present Invention Example | Part | Solvent Name | Part | Other Additive Name | Part |
|---|---|---|---|---|---|---|---|
| 41 | 30 | (2)-7 | 2 | MEK | 88 | | 0.5 |
| 42 | 30 | (2)-8 | 2 | MEK | 87.5 | Compound 1 | |
| 43 | 30 | (2)-9 | 2.5 | MIBK | 87.5 | | |
| 44 | 30 | (3)-2 | 3 | MEK | 86.7 | Compound 1 | 0.3 |
| 45 | 30 | (2)-9 (3)-2 | 5 1 | MEK | 86.7 | Compound 1 | 0.3 |

MEK: methyl ethyl ketone
MIBK: methyl isobutyl ketone

⋇: Seika Fast Yellow H7055 manufactured by Dainichiseika Color & Chemicals Mfg. Co., Ltd.

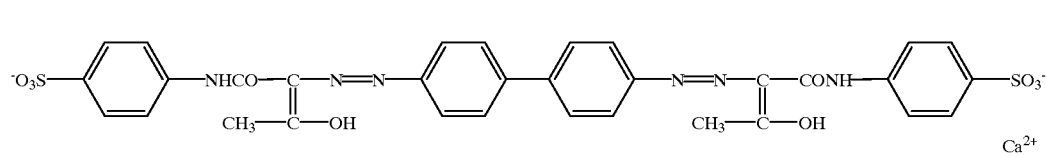

Compound 1

The resulting pigment dispersions 41 to 45 was left alone for one day and then, the sedimentation of each pigment was checked. Furthermore, each particle diameter of the pigment dispersions 41 to 45 was measured by the same equipment as in Example 1. Then, each of the pigment dispersions 41 to 45 was put in a tight-sealed vessel and was left alone. After the elapse of 1, 2, 3 and 6 months, each particle diameter was measured. The results are as follows.

TABLE 10

| Pigment Dispersion | Sedimentation | Particle Diameter (nm) | | | | |
|---|---|---|---|---|---|---|
| | | Next Day | After 1 Month | 2 Months | 3 Months | 6 Months |
| 41 | None | 225 | 222 | 227 | 230 | 228 |
| 42 | None | 212 | 210 | 215 | 215 | 212 |
| 43 | None | 222 | 220 | 215 | 218 | 213 |

TABLE 10-continued

| Pigment Dispersion | Sedimentation | Particle Diameter (nm) | | | | |
|---|---|---|---|---|---|---|
| | | Next Day | After 1 Month | 2 Months | 3 Months | 6 Months |
| 44 | None | 228 | 232 | 230 | 232 | 235 |
| 45 | None | 226 | 228 | 232 | 232 | 230 |

It is found that the pigment dispersions 42 to 45 were excellent in dispersion properties and dispersion stability.

Example 3

Pigment dispersions 51 to 54 were prepared. They were tightly sealed for 3 months and then, each sedimentation was checked. The results are shown in Table 11.

TABLE 11

| Pigment Dispersion | Solid | | Compound of Present Invention | | | Other Additive | | Sedimentation |
|---|---|---|---|---|---|---|---|---|
| | Name | part | Example | part | Solvent | Name | part | |
| 51 | ε-type Copper phthalocyanine | 30 | (2)-3 | 6 | Toluene | | | None |
| 52 | β-type Copper phthalocyanine | 30 | (3)-2 | 4.5 | MEK | Copper phthalocyanine | 1.0 | None |
| 53 | Brilliant Carmin 6B | 20 | (2)-8 | 6 | MEK | Disulfonic acid | | None |
| 54 | Carbon Black | 30 | (2)-9 (3)-2 | 5 1 | MIBK | Copper phthalocyanine disulfonic acid | 1.5 | None |

It was found that pigment dispersions of the present invention caused no sedimentation of the pigment after 3 months in a tight-sealed vessel and excellent at no variation in the particle diameter due to the elapse of time.

Example 14

The following light-sensitive solutions were prepared.

| | |
|---|---|
| QD-1 | 1.7 parts |
| 50 weight percent methanol solution of copolymer (Mw = 60,000) of vinyl acetate and vinyl versatate (80:20 in weight part) | 11.5 parts |
| 50 weight percent methanol solution of copolymer (Mw = 60,000) of vinyl acetate, vinyl versatate and crotonic acid (79:20:1 in weight part) | 10 parts |
| Methyl ethyl ketone | 68 parts |

QD-1

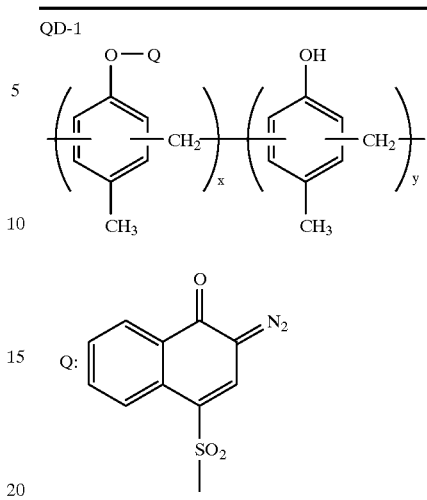

x:y = 1:1 Resin before Q undergoes reaction has Mw = 500.

To 4.5 parts of the pigment dispersion 33 prepared in Example 11, 4.5 parts of methyl ethyl ketone was added with stirring. After confirming the resulting solution became homogeneous enough, 91 parts of the above-described light-sensitive solution 31 was added with stirring and a light-sensitive composition 31 was prepared. Furthermore, a light-sensitive composition 32 was prepared in the same manner as above except that the pigment dispersion prepared in Example 11 was used. Each pigment diameter of the light sensitive compositions 31 and 32 was measured in the same manner as in example 11 and 155 nm and 170 nm were obtained respectively. No appreciable change in dispersion was observed compared to that into which only solid was dispersed.

Example 15

The following light-sensitive solution 32 was prepared.

| | |
|---|---|
| QD-1 | 2.0 parts |
| 50 weight percent methanol solution of copolymer (Mw = 60,000) of vinyl acetate and vinyl versatate (80:20 in weight part) | 11.5 parts |
| 50 weight percent methanol solution of copolymer (Mw = 60,000) of vinyl acetate, vinyl versatate and crotonic acid (79:20:1 in weight parts) | 12 parts |
| Methyl ethyl ketone | 65.5 parts |

To 4.5 parts of the pigment dispersion 31, 4.5 parts of methyl ethyl ketone was added with stirring. After confirming that the resulting solution was homogeneous enough, 91 parts of the above described light-sensitive solution was added with stirring and a light-sensitive composition 33 was prepared. Furthermore, light-sensitive compositions 34 to 39 were prepared in the same manner as the above except that the above-described pigment dispersion 31 was changed to the pigment dispersions 32 to 37 prepared in Example 31. The resulting light-sensitive compositions 33 to 39 were termed coating solutions 31 to 37, respectively. In addition, the coating solution 38 was prepared in the same manner as for the coating solution 33 except that the compound of the present invention in the pigment dispersion 33 prepared in Example 7 was changed to a compound described in Example 11 of Patent Publication Open to Public Inspection No. 7294/1971, which is synthesized by the following formula. Patent Publication Open to Public Inspection No. 7294/1971, Example 11

To 208 parts of reflux benzene, were added 1.5 parts of 4,4'-azobis-4-cyanopentanoyl chloride and then, versatic acid vinyl monomer for 1 hour under nitrogen gas. Then, the resulting solution was refluxed for 5 hours and cooled. To 10 parts of triethylenetetramine was added 40 parts of dehydrated benzene to which the resulting solution was dissolved. Then, the resulting solution was poured to methanol and the resulting polymer was precipitated. The precipitate was separated by filtration and was dried at 60 °C. in a vacuum oven.

Preparation of Support

A support was prepared as follows. A copolymer of ethylene and vinyl acetate (EVAFLEX P-1405: vinyl acetate containing ratio 14 weight percent, VICAT softening point 68° C., manufactured by Mitsui duPont Polychemical Co.) was coated at a thickness of 75 μm on a poly(ethylene terephthalate) film having a thickness of 75 μm by an extrusion laminating method.

Preparation of Light-sensitive Material for Proofs

The coating solutions 31 to 38 each were coated on the resulting support at a dry coating amount of 1.8 g/m$^2$ using a wire bar coating device and dried. Light-sensitive materials 31 to 38 for proofs were thus prepared.

Measurement of Developability

The resulting light-sensitive material for proofs was exposed using the day light room Printer (P-647-GA manufactured by Dainippon Screen Mfg. Co., Ltd.). An exposure amount was decided as follows. The light-sensitive material for proofs was contacted with the Step Tablet for sensitometry (No. 2, 21 steps gray scale, density increment of 0.15 manufactured by Eastman Kodak Co.) and exposed using the above-mentioned printer. Then, the exposed material was developed by the Konica Excelart Developer ED (4 times dilution) at 32° C. for 35 seconds using the Konica Excelart Processor (EX900L manufactured by Konica Corp.) An exposure amount was decided so that the 3.0 step of the above-mentioned Step Tablet became perfectly clear.

Then, after development, remaining carbon black on the support of the light-sensitive material for proofs was observed. It was found that the most carbon black of the light-sensitive material 38 for proofs was not developed and remained as looked entirely black and on the contrary, the carbon black of the light-sensitive materials 31 to 37 was almost developed and remained a little.

Furthermore, the light-sensitive materials 31 to 38 for proofs each were cut to a sheet of 20 cm×40 cm. Five sheets of each were exposed in the same manner as the above. The exposed sheets were developed by the Excelart Developer ED (4 times dilution) at 32° C. for 35 seconds using the Konica Excelart Processor EX900L. Immediately after development, an unexposed Konica Excelart Transfer Film (EP-1Y (A1 size) manufactured by Konica Corp.) was developed under the same condition. The developed Transfer Film was transferred to the Tokubishi Art Paper (manufactured by Mitsubishi Paper Mills, Ltd.) at 70° C. of the drum temperature and 110 ° C. of the pressure roller for 60 seconds of transfer time using the above-mentioned Excelart Processor. When the EP-1Y was developed soon after developing the light-sensitive material 38, it was found that the transferred image on the Art Paper was stained due to the carbon black, while soon after developing the light-sensitive materials 31 to 37, no stain was observed on the transferred image.

Example 16

A light-sensitive solution 33 was prepared as follows.

| | |
|---|---|
| Regal 400R manufactured by CABOT Co. | 20 g |
| Example compound (1)-3 | 4 g |
| Copper phthalocyanine di sulfonic acid | 1 g |
| Michler's ketone | 0.4 g |
| Benzophenone | 2.5 g |
| Pentaerythritol tetracrylate | 60 g |
| 50 percent methanol solution of copolymer (Mw = 60,000) of vinyl acetate and vinyl versatate (copolymerization ratio = 80:20 in weight part) | 140 g |
| 50 percent methanol solution of copolymer (Mw = 60,000) of vinyl acetate, vinyl versatate and vinyl stearate (copolymerization ratio = 80:15:5 in weight part) | 12 g |
| Methyl ethyl ketone | 765 g |

Together with 360 parts of glass beads having a diameter of 1 mm, 240 parts of the resulting light-sensitive solution 33 was put in a vessel for dispersion equipped with a water cooling jacket. After installing a stirring disk, dispersion was carried out for 4 hours at 2,000 rpm and a coating solution 39 was prepared.

Preparation of Light-sensitive Material for Proofs

The coating solution 39 was coated on the support prepared in Example 15 at a dry coating amount of 2 g/m$^2$ using a wire bar coating device and dried. On the resulting light-sensitive layer, poly(ethylene terephthalate) was laminated as a protective layer at a thickness of 15 μm. A light-sensitive material 39 for proofs was thus prepared.

Evaluation of Developability

After peeling off the protective layer of the resulting light-sensitive material 39 for proofs, the light-sensitive layer was removed by immersing the material in the above-mentioned Konica Excelart Developer ED (4 times dilution) at 32° C. for 30 seconds. No remaining carbon black was found on the support.

Example 17

A light-sensitive material 40 for proofs was prepared in the same manner as the above except that the example compound of Example 6 was changed to (3)-2 and the developability was evaluated in the same manner as in Example 16. No remaining carbon black was found on the support and excellent developability was obtained.

With use of a novel compound of the present invention, which enables excellent solid dispersion and fine dispersed state holding for a long period, are obtained remarkably excellent advantages such as excellent solid dispersion and stable dispersion, and no sedimentation in case an intended composition is prepared by the addition of various materials, and broad compatibility for the wide range of materials, and the preparation of a solid dispersion composition wherein a fine dispersed state is hold. Furthermore, when used as a coating solution, a light-sensitive composition having high sensitivity and excellent developability is obtained and especially the composition can be used as color proofs for color proofing in color printing.

We claim:

1. A composition dispersing a colorant in an organic solvent wherein the composition comprises a compound represented by formula (1), (2) or (3);

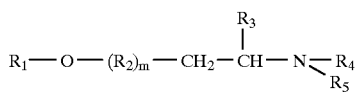
(1)

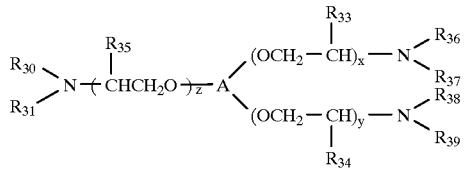
(3)

wherein $R_1$ represents a hydrogen atom, a straight or branched chain alkyl group which may have a substituent group having from 1 to 30 carbon atoms, and an alicyclic hydrocarbon group, an aromatic hydrocarbon group or heterocyclic group each of which may have a substituent group, and m represents an integer of 0 or more, $R_2$ represents:

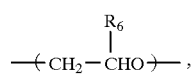

$R_3$ and $R_6$ each represent the same as $R_1$, and $R_4$ and $R_6$ each represent:

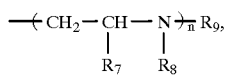

$R_7$, $R_8$ and $R_9$ each represent the same as $R_1$ and n represents an integer of 0;

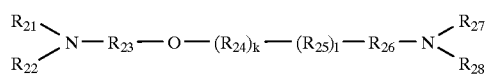
(2)

$R_{21}$, $R_{22}$, $R_{27}$, and $R_{28}$ each represent a hydrogen atom, a straight or branched chain alkyl group which may have a substituent group having from 1 to 30 carbon atoms, and an alicyclic hydrocarbon, aromatic hydrocarbon group or heterocyclic group, each of which may have a substituent group, and $R_{23}$, $R_{24}$, $R_{25}$ and $R_{26}$ each represent the following structural formula, and $R_{202}$, $R_{203}$, $R_{204}$, $R_{205}$, and $R_{206}$ each are the same as $R_{21}$, and k represents an integer of 0 or more and I represents an integer of 1 or more,

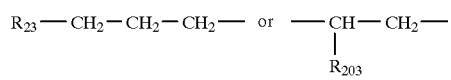

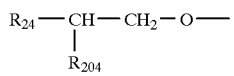

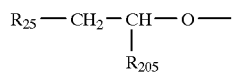

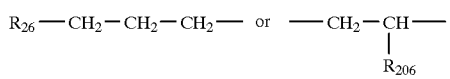

wherein A represents a straight or branched alkyl group having at least 3 hydroxyl groups, which may have a substituent group, an alicyclic hydrocarbon, aromatic hydrocarbon, heterocyclic group or a residual group of a heterocyclic group, each of which may have a substituent group, and $R_{30}$ to $R_{39}$ each represent a hydrogen atom, a straight or branched chain alkyl group which may have a substituent group having from 1 to 30 carbon atoms, and x, y and z each represent an integer of 1 or more and the total of them is 5 or more.

2. A composition as claimed in claim 1 wherein the composition comprises a compound represented by formula (1):

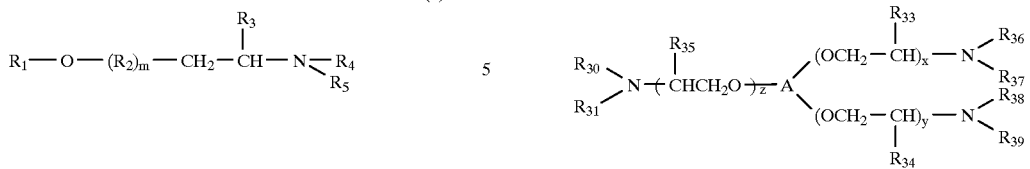
(1)

wherein $R_1$ represents a hydrogen atom, a straight or branched chain alkyl group which may have a substituent group having from 1 to 30 carbon atoms, and an alicyclic hydrocarbon group, an aromatic hydrocarbon group or heterocyclic group each of which may have a substituent group, and m represents an integer of 0 or more, $R_2$ represents:

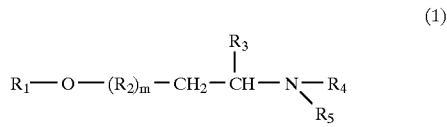

$R_4$ and $R_6$ each represent the same as $R_1$, and $R_4$ and $R_5$ each represent:

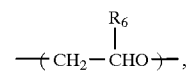

$R_7$, $R_8$ and $R_9$ each represent the same as $R_1$ and n represents an integer of 0.

3. A composition as claimed in claim 2 wherein the compound represented by formula (1) is represented by formula (4);

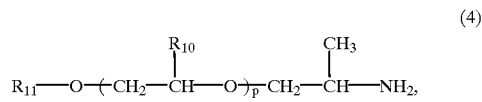
(4)

wherein $R_{10}$ represents a hydrogen atom and a methyl group, $R_{11}$ represents a straight or branched chain alkyl group, and p is from 10 to 50.

4. A composition as claimed in claim 1 wherein an amount of the compound represented by the formulas (1), (2) or (3) is from 0.1 to 60 weight percent of the weight of the colorant.

5. A composition as claimed in claim 4 wherein an amount of the compound represented by the formulas (1), (2) or (3) is from 2 to 40 weight percent of the weight of the colorant.

6. A composition as claimed in claim 1 wherein an amount of the colorant is from 0.1 to 40 weight percent of the whole dispersion composition.

7. A composition as claimed in claim 1 wherein the colorant is organic pigment, dye or inorganic pigment.

8. A composition as claimed in claim 1 wherein the composition comprises a light-sensitive compound.

9. A composition as claimed in claim 8 wherein the light-sensitive compound is a diazo compound or an azide compound.

10. A composition as claimed in claim 8 wherein an amount of the light-sensitive compound is 0.5 to 40 weight percent of the coloarant.

11. A composition as claimed in claim 8 wherein the light-sensitive compound is a quinonediazide compound.

* * * * *

UNITED STATES PATENT AND TRADEMARK OFFICE
CERTIFICATE OF CORRECTION

PATENT NO. : 5,942,368
DATED : August 24, 1999
INVENTOR(S) : Takeo AKIYAMA et al.

It is certified that error appears in the above-identified patent and that said Letters Patent is hereby corrected as shown below:

IN THE CLAIMS:

Claim 1, col. 49, line 25, change "$R_6$" to --$R_5$--.

Claim 10, col. 52, line 6, change "coloarant" to --colorant--.

Signed and Sealed this

Thirteenth Day of June, 2000

Attest:

Q. TODD DICKINSON

*Attesting Officer*    *Director of Patents and Trademarks*